(12) United States Patent
Okada et al.

(10) Patent No.: US 9,250,301 B2
(45) Date of Patent: Feb. 2, 2016

(54) ENCODER

(75) Inventors: Yasuyuki Okada, Nagaokakyo (JP);
Yasunori Abe, Nagaokakyo (JP)

(73) Assignee: HITACHI METALS, LTD., Tokyo (JP)

( * ) Notice: Subject to any disclaimer, the term of this patent is extended or adjusted under 35 U.S.C. 154(b) by 198 days.

(21) Appl. No.: 14/117,555

(22) PCT Filed: Aug. 10, 2012

(86) PCT No.: PCT/JP2012/070569
§ 371 (c)(1),
(2), (4) Date: Nov. 13, 2013

(87) PCT Pub. No.: WO2013/024830
PCT Pub. Date: Feb. 21, 2013

(65) Prior Publication Data
US 2014/0152299 A1    Jun. 5, 2014

(30) Foreign Application Priority Data
Aug. 12, 2011  (JP) .................................. 2011-176904

(51) Int. Cl.
*G01R 33/09* (2006.01)
*G01B 7/14* (2006.01)
*G01D 5/245* (2006.01)
(Continued)

(52) U.S. Cl.
CPC ................ *G01R 33/09* (2013.01); *G01B 7/003* (2013.01); *G01D 5/2451* (2013.01); *G01D 5/24438* (2013.01)

(58) Field of Classification Search
CPC ........................................................ G01R 33/09
USPC ...................................................... 324/207.21
See application file for complete search history.

(56) References Cited

U.S. PATENT DOCUMENTS 7,071,681 B1    7/2006  Shiraki et al.
2010/0052664 A1  3/2010  Nishizawa et al.

FOREIGN PATENT DOCUMENTS

| JP | A-59-147213 | 8/1984 |
| JP | B2-2529960 | 9/1996 |
| JP | A-10-185507 | 7/1998 |

(Continued)

OTHER PUBLICATIONS

Sep. 4, 2012 International Search Report issued in International Patent Application No. PCT/JP2012/070569.

(Continued)

*Primary Examiner* — Bot Ledynh
(74) *Attorney, Agent, or Firm* — Oliff PLC

(57) ABSTRACT

A magnetic medium is magnetized in the relative movement direction at a predefined pitch λm and a magnetic sensor includes plural magnetoresistive elements whose electrical resistance value changes depending on a magnetic field at a place where the magnetoresistive element is disposed. A position where the magnetoresistive element is disposed is defined as a reference position and, in addition to the magnetoresistive element of this reference position, the magnetoresistive elements as harmonic reducing patterns are disposed at the following positions, with P(n) defined as the n-th prime: a position offset by $\lambda m/(2 \cdot P(n))$ from the reference position toward at least one side of the relative movement direction, wherein $N \geq n > 1$ and N is a natural number satisfying $N > 3$, and a position further offset by $\lambda m/(2 \cdot P(L+1))$ from a position offset by $\lambda m/(2 \cdot P(L))$, wherein $1 < L < N$.

5 Claims, 16 Drawing Sheets

(51) Int. Cl.
  *G01B 7/00* (2006.01)
  *G01D 5/244* (2006.01)

(56) References Cited

FOREIGN PATENT DOCUMENTS

| | | |
|---|---|---|
| JP | A-2002-206950 | 7/2002 |
| JP | A-2007-121253 | 5/2007 |
| WO | WO 2008/130002 A1 | 10/2008 |

OTHER PUBLICATIONS

Feb. 18, 2014 International Preliminary Report of Patentability issued in International Patent Application No. PCT/JP2012/070569.

Mar. 27, 2015 Extended Search Report issued in European Application No. 12823816.9.

Jul. 3, 2015 Office Action issued in Chinese Patent Application No. 201280022191.0.

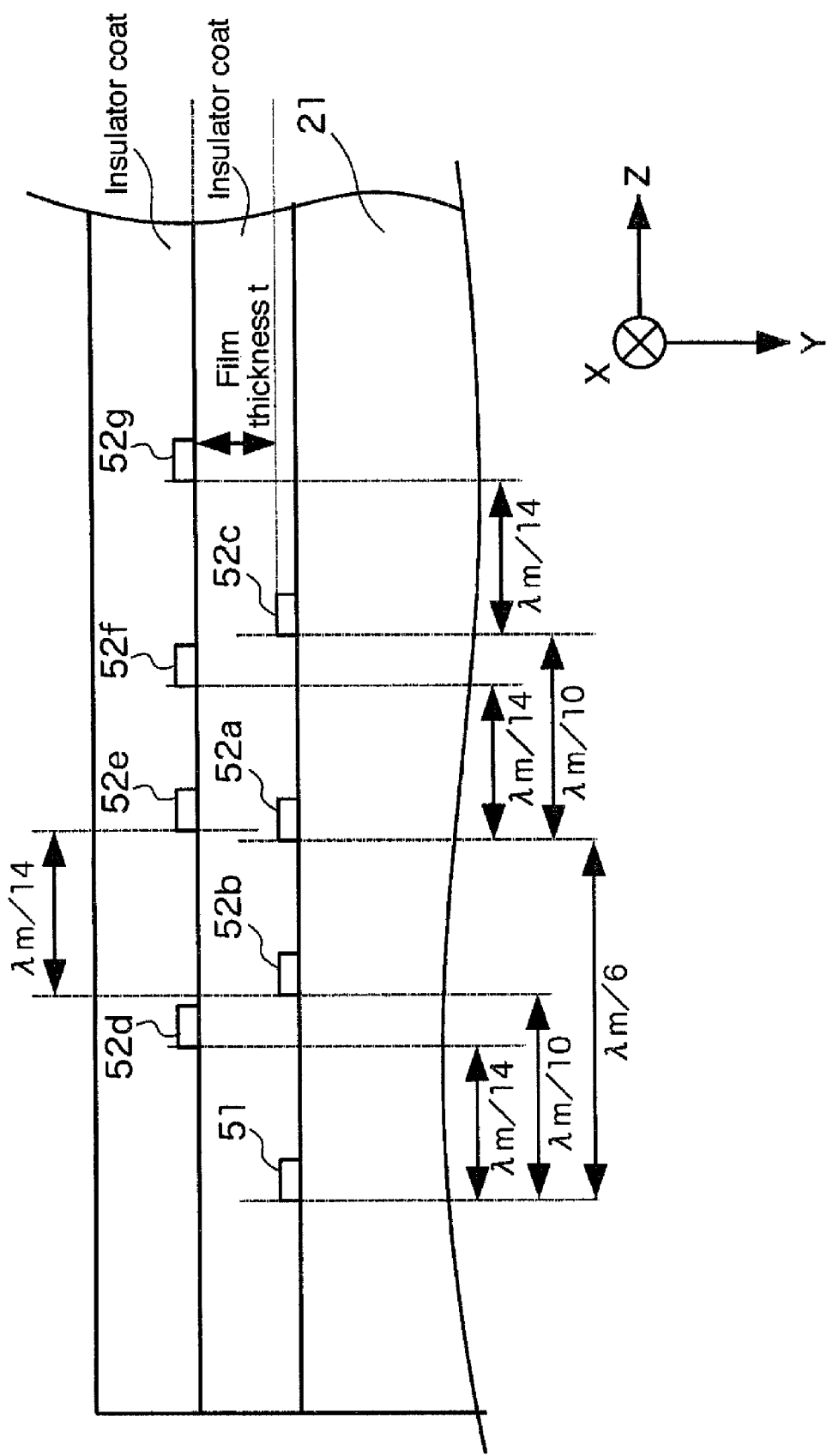

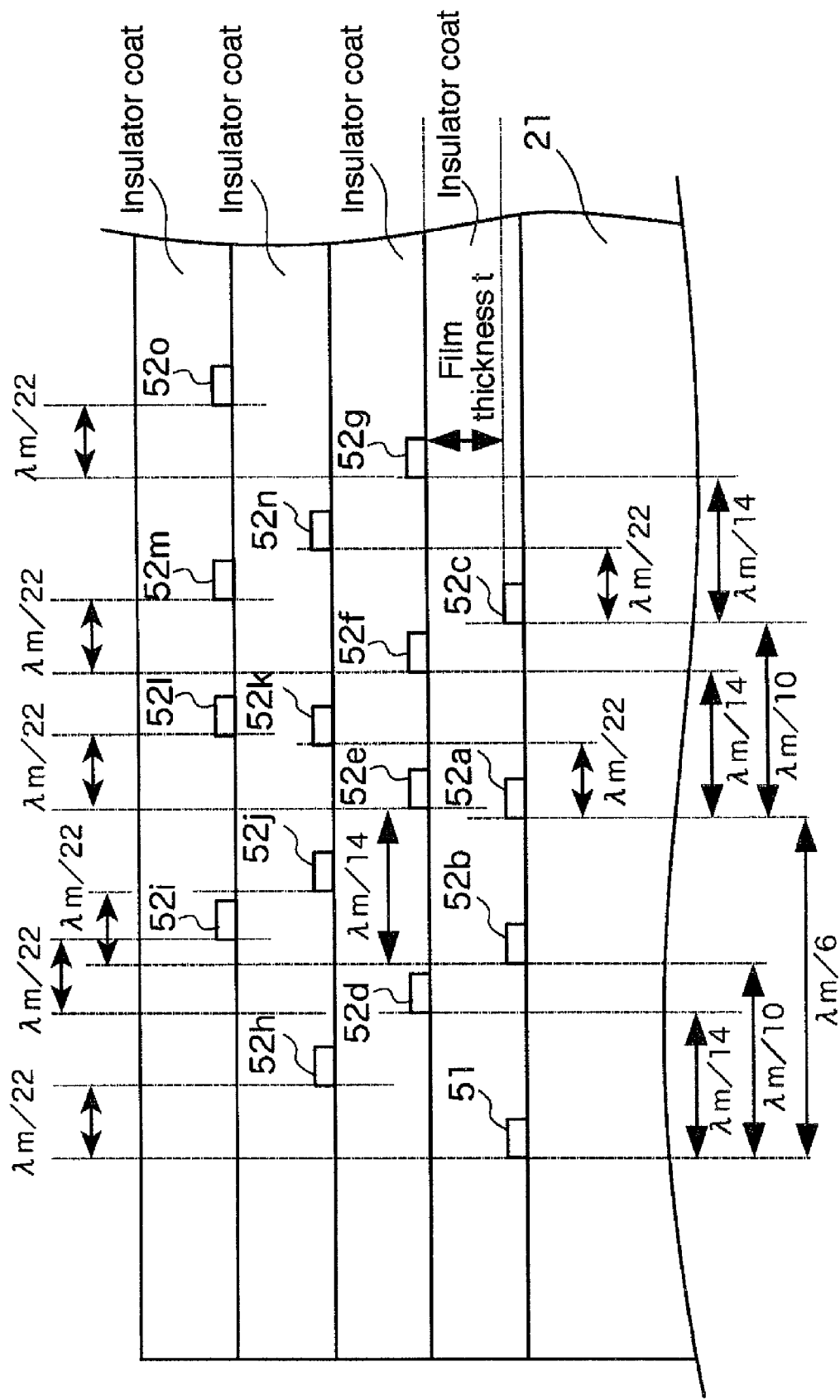

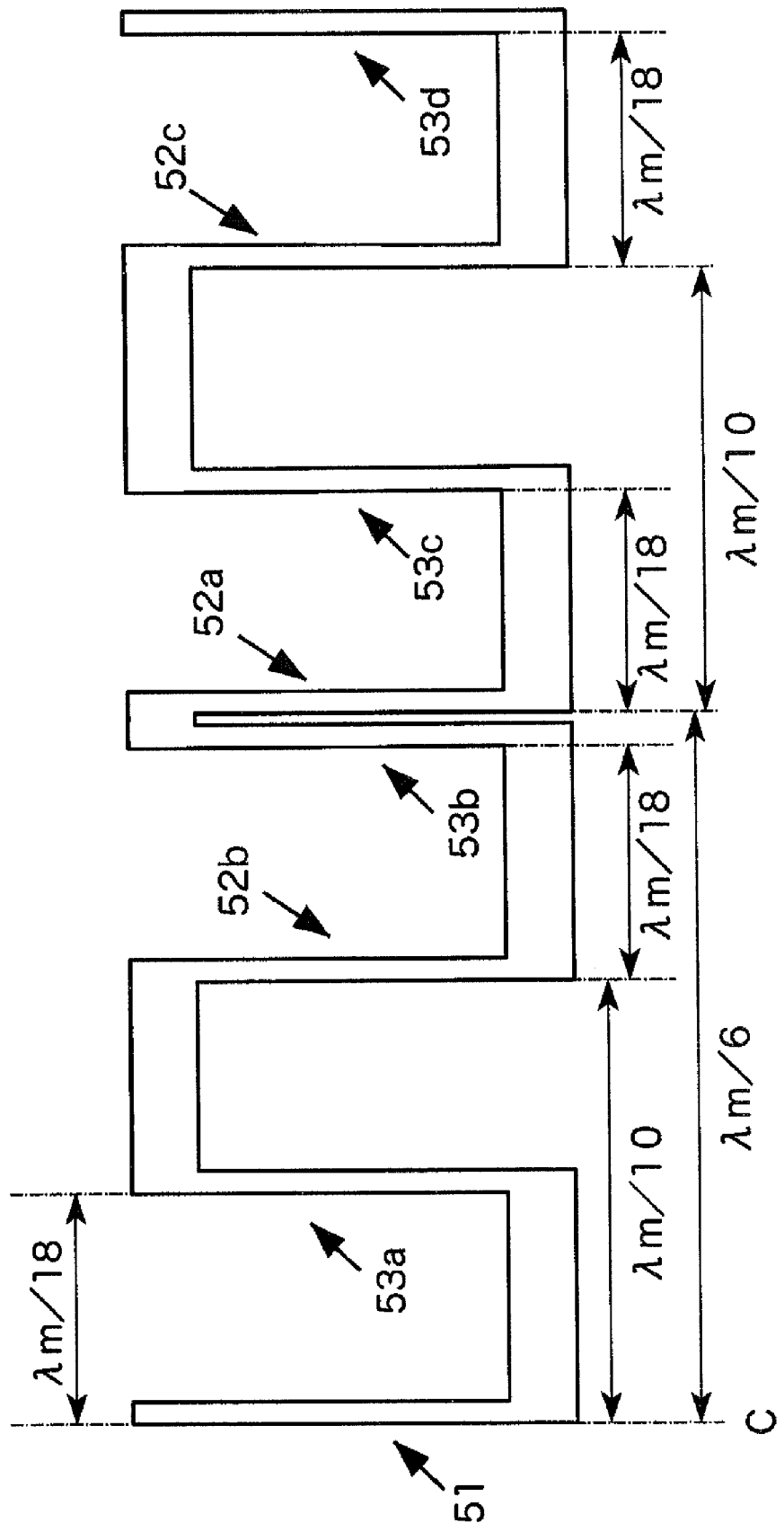

Disposing position of harmonic reducing pattern

Disposing position of harmonic reducing pattern

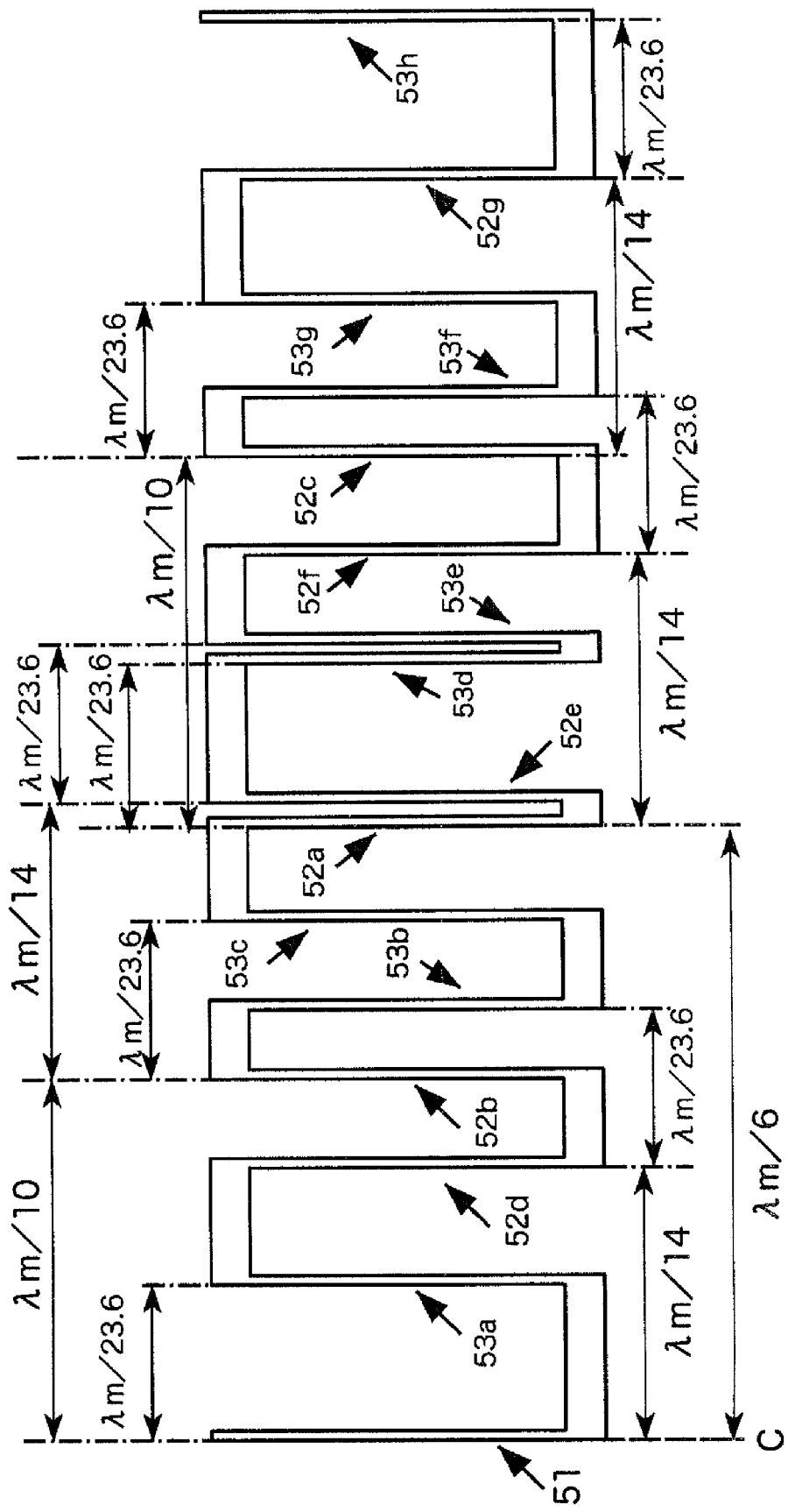

ENCODER

TECHNICAL FIELD

The present disclosure relates to an encoder and particularly relates to reduction of harmonics.

BACKGROUND

An encoder of a magnetic system is known that uses a magnetic medium in which N-poles and S-poles are so disposed as to alternately line and detects the amount of movement by detecting change in the leakage magnetic field from a magnetic medium by a magnetic sensor that moves relative to this magnetic medium (Patent Document 1).

The detection accuracy of this encoder becomes higher as a pitch $\lambda$ at which the magnetization direction is made different is set shorter. However, when the pitch $\lambda$ is set short, the leakage magnetic field from the magnetic medium surface becomes small. Thus, it becomes difficult to obtain a sufficient output signal unless the magnetic sensor is brought so close to the magnetic medium as to get contact with the magnetic medium and slide thereon.

An example of the output signal when the magnetic sensor moves on the magnetic medium is shown in FIG. 15A. When this signal is represented with orders of included signal components, as shown in FIG. 15B, signals of odd-order harmonics are included besides the primary signal (fundamental) originally required. Although the component of the harmonic becomes smaller as the order thereof becomes higher, the detection accuracy of the signal deteriorates due to this harmonic in some cases. In a certain example, when the amplitude of the primary signal (fundamental) is defined as 100%, the amplitudes of harmonics are as follows: the amplitude of the third-order harmonic is 30% of the amplitude of the fundamental; the amplitude of the fifth-order harmonic is 10% of the amplitude of the fundamental; and the signal of the seventh-order harmonic is 5% in turn.

Conventionally, in order to cancel such harmonics, as shown in FIG. 16, a harmonic cancelling pattern for cancelling out the harmonics is provided at a position offset from a first magnetoresistive element as a magneto-sensitive element by a predetermined distance ($\lambda/(2n)$ in the case of the n-th-order harmonic, wherein $\lambda$ is the magnetization pitch of the magnetic medium). Specifically, in Patent Document 2, an example of a position detector that reads position information whose cycle changes with a fundamental wavelength $\lambda$ written to a scale by a magnetic sensor is disclosed. The magnetic sensor includes first, second, and third magnetoresistive elements that output the position information by a predetermined signal, and the second and third magnetoresistive elements are disposed on both sides of the first magnetoresistive element at an interval $\delta$ and are connected in series. In this example, based on the idea that the n-th-order harmonic is canceled by satisfying a condition of $r+2\cos(2n\pi\delta/\lambda)=0$ (n is an odd number equal to or larger than 3) when the ratio of the outputs of the first magnetoresistive element and the second and third magnetoresistive elements is r, the output ratio r of the respective magnetoresistive elements is adjusted.

In Patent Document 3, an example is disclosed in which MR elements are used as magnetoresistive elements and the MR elements are disposed with offset of positions by an interval of $(n/2\pm m/(2k))\times\lambda$, wherein the pitch of NS of the signal magnetic field is $\lambda$, n is an integer, m is an odd number, and the order of the harmonic is k (e.g. a configuration of FIG. 14 intended to cancel the seventh-order harmonic). However, in this Patent Document 3, no disclosure is made about the spin-valve GMR element. The MR element is referred to also as the AMR element.

PRIOR ART DOCUMENTS

Patent Documents

Patent Document 1: Japanese Patent Laid-open No. 2007-121253
Patent Document 2: Japanese Patent Laid-open No. Hei 10-185507
Patent Document 3: Japanese Patent No. 2529960 (Japanese Patent Laid-open No. Sho 63-225124)

SUMMARY

So far, to achieve a higher resolution of the encoder, the gap between the magnetic medium and the magnetic sensor needs to be set extremely small, and they need to be so used as to be made to slide depending on the case. That the magnetic medium and the magnetic sensor are brought close to each other means that the sensor output greatly varies easily with respect to the offset distance, and causes concern that the degree of freedom of the device design would be reduced. Furthermore, in the case of using a magnetic scale (magnetic medium) that is long in the relative movement direction, if the magnetic sensor is moved over a long distance with the contact state kept, large torque is necessary for the drive device (motor or the like) due to frictional resistance. Thus, it is difficult for a small-size motor to deal with it, and this precludes downsizing of the device.

The present disclosure is devised in view of the above-described circumstances and one of objects thereof is to provide an encoder that allows a magnetic medium and a magnetic sensor to be opposed with the intermediary of a gap and can enhance the detection accuracy of the amount of movement.

The disclosure to solve the problems of the above-described conventional example is an encoder including a magnetic medium and a magnetic sensor that is opposed to the magnetic medium with the intermediary of a gap and moves relative to the magnetic medium. The magnetic medium is magnetized in the direction of the relative movement at a pitch $\lambda m$. The magnetic sensor includes a plurality of magnetoresistive elements whose electrical resistance value changes depending on a magnetic field at a place where the magnetoresistive element is disposed. A position where the magnetoresistive element is disposed is defined as a reference position and, in addition to the magnetoresistive element of the reference position, the magnetoresistive elements as harmonic reducing patterns are disposed at the following positions, with P(n) defined as an n-th prime, wherein n=1, 2, 3 . . . , i.e. n is a natural number: a position offset by $\lambda m/(2 \cdot P(n))$ from the reference position toward at least one side of the direction of the relative movement in plan view, wherein N≥n>1 and N is a natural number; and a position further offset by $\lambda m/(2 \cdot P(L+1))$ from a position offset by $\lambda m/(2 \cdot P(L))$ from the reference position toward at least the one side of the direction of the relative movement in plan view, wherein P(L) is an L-th prime and L is a natural number satisfying 1<L<N.

Advantageous Effect

According to the present disclosure, harmonics included in the output of the magnetic sensor can be reduced. Furthermore, the magnetic medium and the magnetic sensor are allowed to be opposed with the intermediary of a gap and the detection accuracy of the amount of movement can be enhanced.

BRIEF DESCRIPTION OF DRAWINGS

FIG. 7 is an explanatory diagram showing an example in which the magnetoresistive elements in the encoder according to the embodiment of the present disclosure are disposed in multiple layers.

FIG. 8 is an explanatory diagram showing another example in which the magnetoresistive elements in the encoder according to the embodiment of the present disclosure are disposed in multiple layers.

FIG. 12 is an explanatory diagram showing further another example of the arrangement of the magnetoresistive elements in the encoder according to the embodiment of the present disclosure.

FIG. 14 is an explanatory diagram showing further another example of the arrangement of the magnetoresistive elements in the encoder according to the embodiment of the present disclosure.

DESCRIPTION OF EMBODIMENTS

Figure 1:
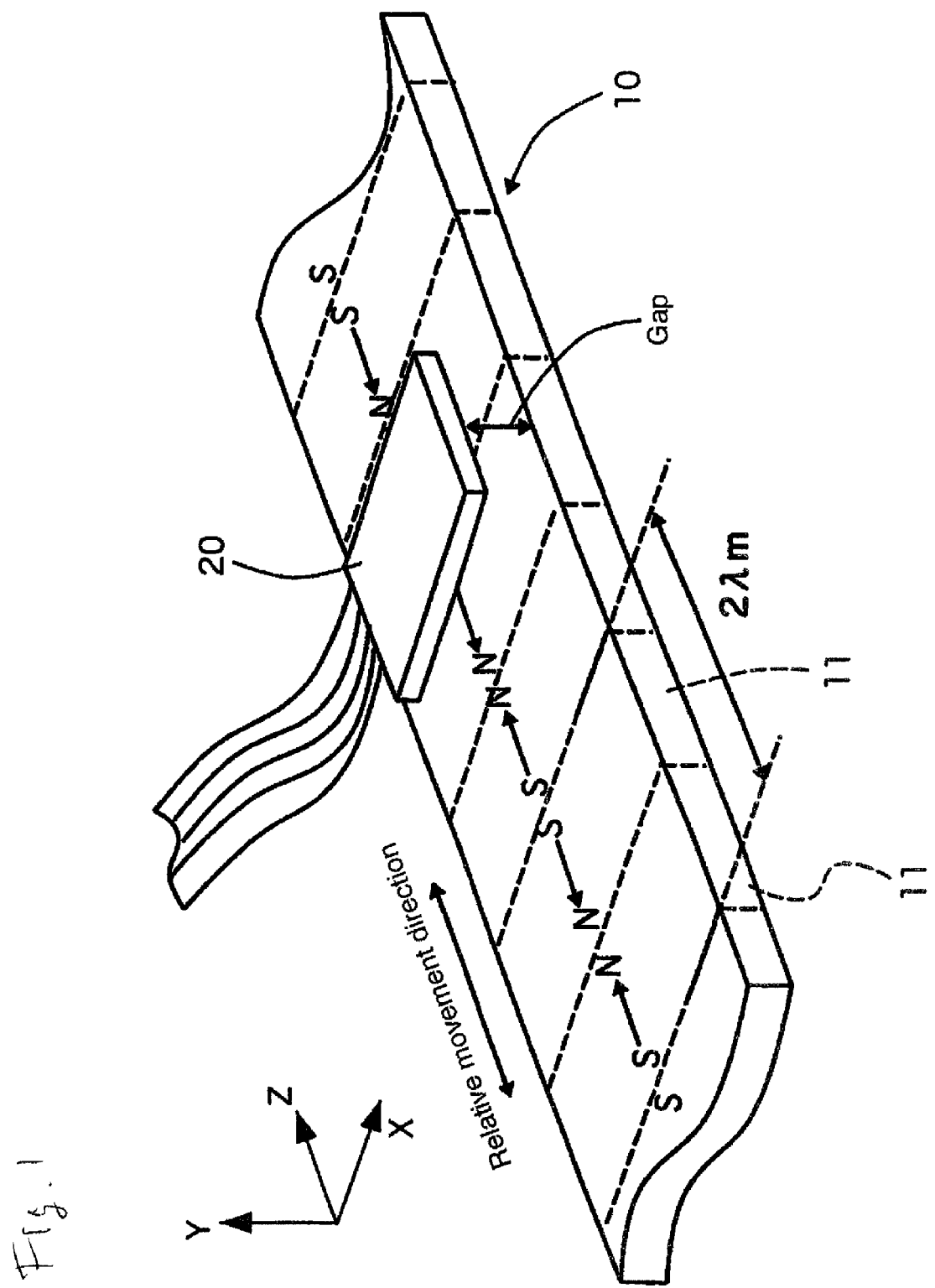
FIG. 1 is an explanatory diagram showing the outline of an encoder according to an embodiment of the present disclosure.

An embodiment of the present disclosure will be described with reference to the drawings. As exemplified in FIG. 1, an encoder according to the embodiment of the present disclosure is so configured as to include a magnetic medium 10 and a magnetic sensor 20. Furthermore, as exemplified in FIG. 2, the magnetic sensor 20 includes a base 21, a magneto-sensitive element 22, and a wiring part 23. This magneto-sensitive element 22 is disposed on the base 21 and includes e.g. plural spin-valve (SV) giant magnetoresistive (GMR) elements. Hereinafter, the spin-valve giant magnetoresistive element is referred to as the SVGMR element. As shown in FIG. 2, this SVGMR element is an element having a multilayer structure of a pinned layer 31, a non-magnetic intermediate layer 32, and a free layer 33. In the present embodiment, these magnetic medium 10 and magnetic sensor 20 have planes (XZ planes) opposed with the intermediary of a gap and relatively move in a predetermined direction (hereinafter, referred to as the relative movement direction). Due to the intermediary of the gap, the magnetic medium and the magnetic sensor are in non-contact. The encoder is not limited to the linear encoder and may be a rotary encoder.

Figure 2:
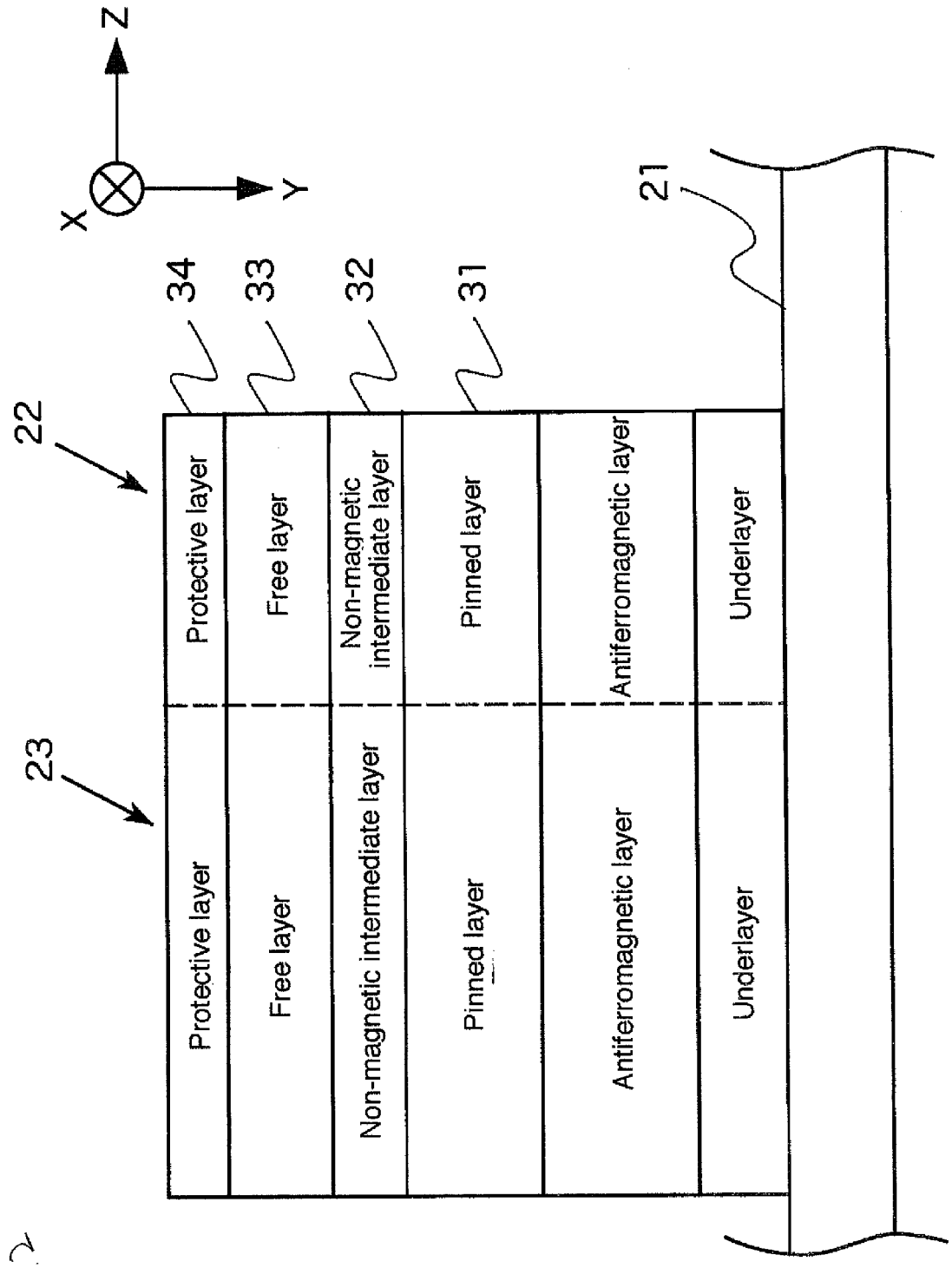
FIG. 2 is an explanatory diagram showing a configuration example of a magnetoresistive element in the encoder according to the embodiment of the present disclosure.

As shown in FIG. 1, the magnetic medium 10 is made by disposing magnetic medium elements 11 on one row. This magnetic medium element 11 is so magnetized that the direction of the relative movement with the magnetic sensor 20 (hereinafter, referred to simply as the movement direction) and the magnetization direction are parallel. That is, the direction in which it is magnetized is the magnetization direction. The magnetic medium 10 is obtained by disposing the magnetic medium elements 11 on one row in such a manner that the same poles face each other in the magnetic medium elements 11 adjacent to each other. That is, the magnetic medium elements 11 adjacent to each other are magnetized in directions opposite to each other and are so disposed that order of . . . N-S, S-N, N-S, . . . is set along the movement direction as a whole. This provides the state in which the magnetic medium elements 11 magnetized in directions opposite to each other are disposed alternately and on one row at a constant pitch $\lambda m$ in the magnetic medium 10 of the present embodiment. This pitch $\lambda m$ is set longer compared with an encoder in which the magnetic medium 10 and the magnetic sensor 20 relatively move in contact.

As exemplified in FIG. 2, the SVGMR element is an element including the pinned layer 31 in which the magnetization direction is pinned, the free layer 33 in which the magnetization direction changes depending on an external magnetic field, and the non-magnetic intermediate layer 32 provided between these pinned layer 31 and free layer 33. Furthermore, when either the free layer 33 or the pinned layer 31 is located on the surface side, a protective layer (cap layer) 34 may be provided on the surface side.

In this pinned layer 31, the magnetization direction is pinned to a predefined direction. The present embodiment is based on the assumption that it is magnetized in the direction of the relative movement with respect to the magnetic medium 10 (hereinafter, referred to as the movement direction).

The SVGMR element according to a certain aspect of the present embodiment is fabricated by using DC magnetron sputtering apparatus. Specifically, it is made by stacking thin films in the following order over e.g. a glass substrate serving as the base: underlying layer (NiFeCr (3 nm)/NiFe (1 nm))/antiferromagnetic layer (MnPt (14 nm))/pinned layer (CoFe (1.8 nm)/Ru (0.9 nm)/CoFe (2.2 nm))/non-magnetic intermediate layer (Cu (2.1 nm))/free layer (CoFe (1 nm)/NiFe (3 nm))/back layer (Cu (0.6 nm))/protective layer (Ta (3 nm)) (numeral in brackets denotes the film thickness).

The pinning method of the magnetization direction of the pinned layer 31 and a method for giving anisotropy to the free layer 33 to enhance the magnetic characteristics are widely known and therefore detailed description thereof here is omitted. As such a SVGMR element, e.g. one described in Japanese Patent Laid-open No. 2007-285805, Japanese Patent Laid-open No. 2008-306112, or Japanese Patent Laid-open No. 2010-112881 can be used. Furthermore, a spin-valve giant magnetoresistive element of a tunnel junction type using a non-magnetic insulating layer as the non-magnetic intermediate layer may be used.

In the present embodiment, the following process is carried out in order to obtain the magnetic sensor 20. First, on the base 21, a multilayer structure including the pinned layer 31, the non-magnetic intermediate layer 32, the free layer 33, and the protective layer 34 as described above is formed. Thereafter, a resist mask with a desired element shape is fabricated on this multilayered film by photolithography and ion milling by use of an argon ion or the like is performed to form a pattern configuring the magnetic sensor 20. In the pattern of the magnetic sensor 20, the wiring part 23 is formed by patterning a multilayer structure similar to the magnetoresistive element. However, the width of this wiring part 23 is set larger compared with the magnetoresistive element in order for the wiring part 23 not to operate as the magnetoresistive element. Due to this, the wiring part 23 is so made as not to act as a resistor but to act as wiring. Furthermore, wiring for forming a bridge circuit by connecting patterns (basic patterns) that are so formed as to include plural SVGMR elements and wiring parts 23 with each other is formed by using a metal thin film of e.g. Cu, Al, etc. Moreover, the wiring for the connection among these magnetoresistive elements, wiring parts 23, and basic patterns may be covered by an insulator. This insulator may be formed by using a general insulating material such as aluminum oxide ($Al_2O_3$) or silicon oxide ($SiO_2$).

Figure 3:
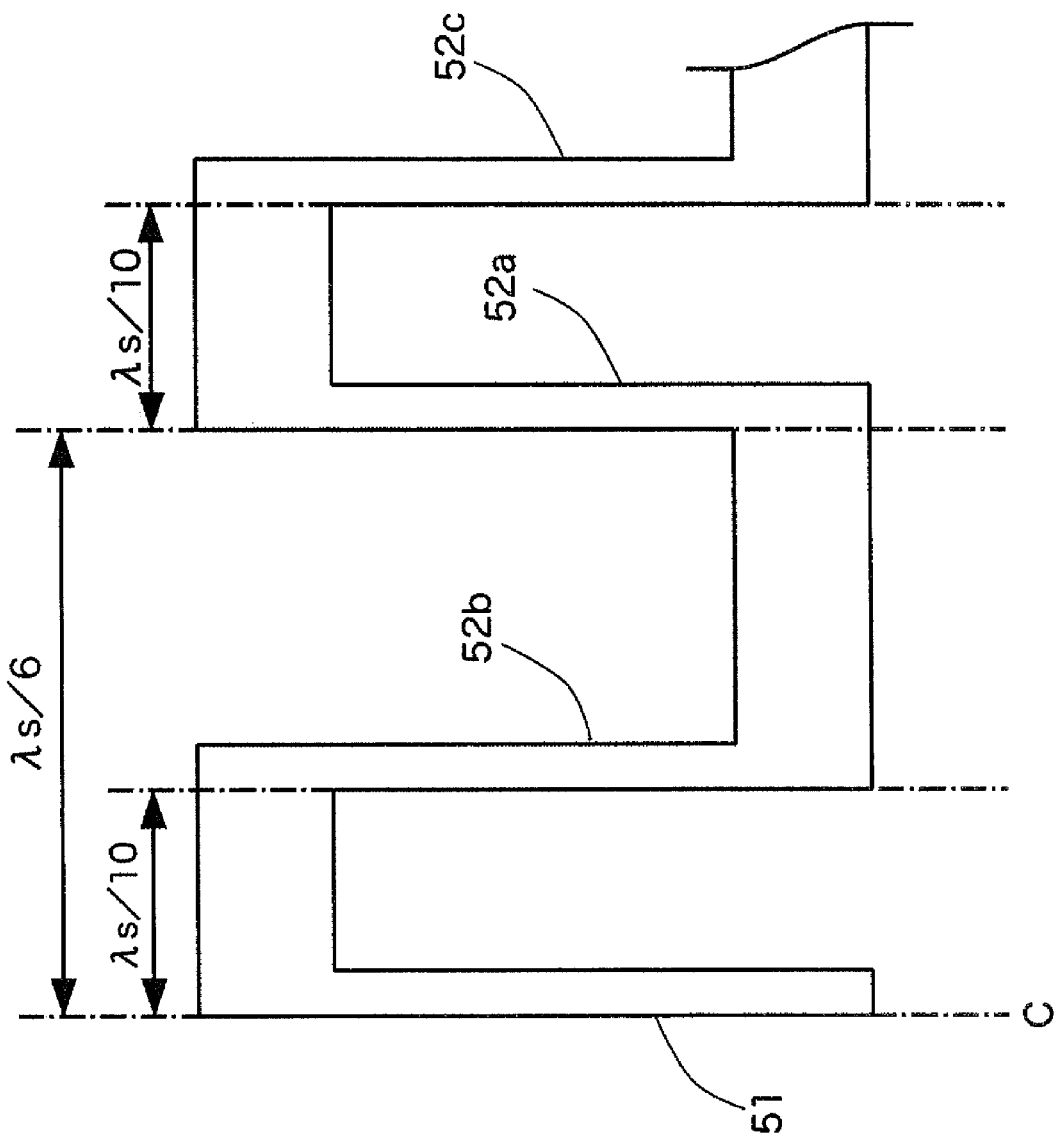
FIG. 3 is an explanatory diagram showing one example of the arrangement of the magnetoresistive elements in the encoder according to the embodiment of the present disclosure.

As shown in FIG. 3, one example of the pattern (basic pattern) of the magnetic sensor 20 of the present embodiment forms a meander shape as a whole. Specifically, it includes a detecting element pattern including a magnetoresistive element 51 extending along the direction perpendicular to the movement direction and harmonic canceling patterns 52a, b . . . connected in series to this magnetoresistive element 51, and is made by interconnecting them by the wiring part 23. Here, the harmonic canceling pattern 52 is also a magnetoresistive element. The magnetoresistive element of this harmonic canceling pattern 52 is also formed similarly to the magnetoresistive element 51. In the case of using a SVGMR element as the magnetoresistive element, a signal cycle $\lambda s$ is in a relationship of $\lambda s = 2 \times \lambda m$ with respect to the magnetization pitch $\lambda m$. These detecting element pattern and harmonic canceling pattern function as a position detector 50.

If the magnetoresistive element is an AMR element or a multilayer GMR element, $\lambda s = \lambda m$ holds. The AMR element is corresponding to a magnetoresistive element formed by a single-layer film. The multilayer GMR element is corresponding to a magnetoresistive element obtained by repeatedly stacking non-magnetic layers and magnetic layers alternately a large number of times.

In the present embodiment, the position of one end of the magnetoresistive element 51 in the width direction (here, defined as the end opposite to the disposing direction) is defined as a detection position C. Furthermore, in the present embodiment, this detection position C is deemed as the reference position and the plural harmonic canceling patterns 52 are disposed in accordance with the following rule. Specifically, the state in which the detecting element pattern is disposed is deemed as the initial state and defined as a first stage (i=1; hereinafter i is a natural number). Then, in addition to the detecting element pattern and the harmonic canceling pattern 52 disposed by the relevant stage, magnetoresistive elements of the new harmonic canceling patterns 52 are each disposed at a position of $\lambda m/(2 \cdot P(i+1))$ from at least one of these other magnetoresistive elements already disposed in the relative movement direction in plan view. Here, P(n) means the n-th prime. That is, P(i+1) means the (i+1)-th prime. Specifically, in the case of i=1, i+1 is "2" and the second prime is "3." Therefore, the position of the magnetoresistive element of the harmonic canceling pattern 52 is a position of $\lambda m/6$ from another magnetoresistive element in the relative movement direction in plan view. Because the SVGMR element is used here, from the relationship of $\lambda s = 2 \times \lambda m$, the magnetoresistive element at this position of $\lambda m/6$ serves as a canceling pattern of the third-order harmonic.

The description of "in plan view" means that variation in the thickness direction may be present at an ignorable level with respect to the distance from this reference position ($\lambda m/(2 \cdot P(i+1))$). The description of "in the relative movement direction" means that the magnetoresistive element may be disposed with an offset in the direction perpendicular to the relative movement direction in plan view.

Figure 4:
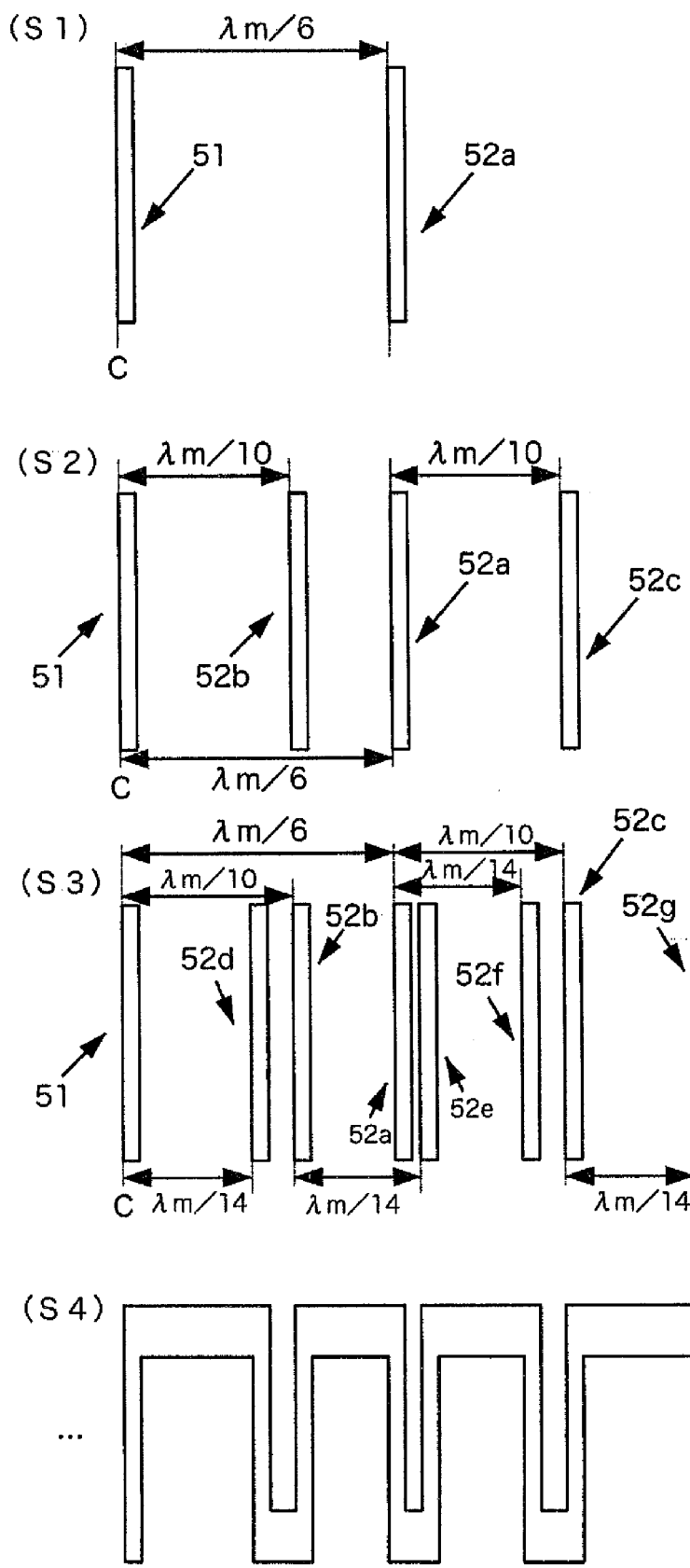
FIG. 4 is an explanatory diagram showing a method for deciding the disposing positions of the magnetoresistive elements in the encoder according to the embodiment of the present disclosure.

At the first stage, because only the detecting element pattern is present, the detection position C is defined as the reference position and one harmonic canceling pattern 52 is disposed at a position offset from this reference position by $\lambda m/6$ on predefined either one side (hereinafter, referred to as the disposing side) of the relative movement direction (S1 in FIG. 4). Because the SVGMR element is used here, the relationship of $\lambda s = 2 \times \lambda m$ holds. The magnetoresistive element disposed at a position offset from this detection position C by $\lambda m/(2 \cdot P(i+1))$ toward the disposing side of the relative movement direction works as a pattern to cancel the P(i+1)-th harmonic. Hereinafter, the magnetoresistive element disposed at the position offset from the detection position C by $\lambda m/(2 \cdot P(i+1))$ will be referred to as the P(i+1)-th harmonic canceling pattern. The harmonic canceling pattern 52a disposed at this first stage therefore serves as a third-order harmonic canceling pattern.

This is followed by repetition of setting of the disposing position of the next respective stages with increment of i one by one until i becomes predefined N. Specifically, at the i-th stage, magnetoresistive elements of the new harmonic canceling patterns 52 are disposed at a position of $\lambda m/(2 \cdot P(i+1))$ (wherein P(n) is the n-th prime. That is, a position of $\lambda m/6$ in the case of i=1) from the magnetoresistive elements of the detecting element pattern and the harmonic canceling pattern 52 disposed by this stage (from S2 to S4 in FIG. 4).

According to this, at the second stage, each one of the harmonic canceling patterns 52*b* and *c* is disposed at a position of $\lambda m/10$ from the detecting element pattern toward the disposing side and a position of $\lambda m/10$ from the third-order harmonic canceling pattern toward the disposing side, respectively. They serve as fifth-order harmonic canceling patterns.

Furthermore, at the third stage, each one of harmonic canceling patterns 52*d, e, f,* and *g* is disposed at total four positions, i.e. a position of $\lambda m/14$ from the detecting element pattern toward the disposing side, a position of $\lambda m/14$ from the third-order harmonic canceling pattern toward the disposing side, and each of positions (two positions) of $\lambda m/14$ from a respective one of the two fifth-order harmonic canceling patterns toward the disposing side, respectively. They serve as seventh-order harmonic canceling patterns. Harmonics that are not on the prime order among odd-order harmonics have an odd divisor smaller than their own selves and therefore are canceled by the effect of the harmonic canceling pattern corresponding to the order of this divisor. For example, the ninth-order harmonic is canceled by the third-order harmonic canceling pattern corresponding to the third order, which is an order of an odd divisor smaller than 9. Therefore, the ninth-order harmonic canceling pattern does not necessarily need to be provided in the present embodiment (it may be provided daringly). Although FIG. 4 shows an example in which patterns up to the seventh-order pattern are disposed, harmonic canceling patterns of orders higher than it may be disposed.

In the present embodiment, the harmonic canceling patterns 52 disposed by this method and the detecting element pattern are folded back into a meander shape and are connected to provide a pattern of the magnetic sensor 20. The magnetic sensor 20 in the present embodiment has at least one basic pattern defined in this manner.

Figure 5A:
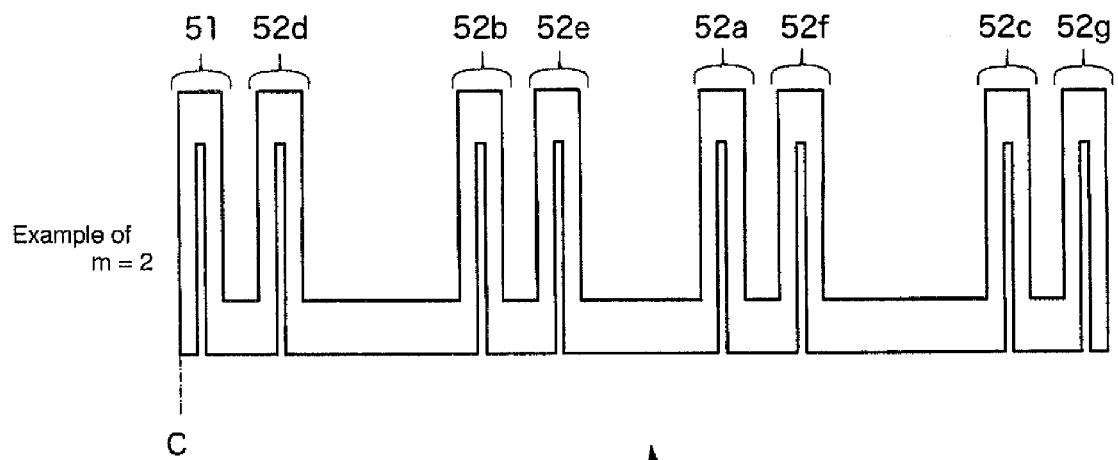
FIG. 5A is an explanatory diagram showing other examples of the arrangement of the magnetoresistive elements in the encoder according to the embodiment of the present disclosure.
Figure 5B:
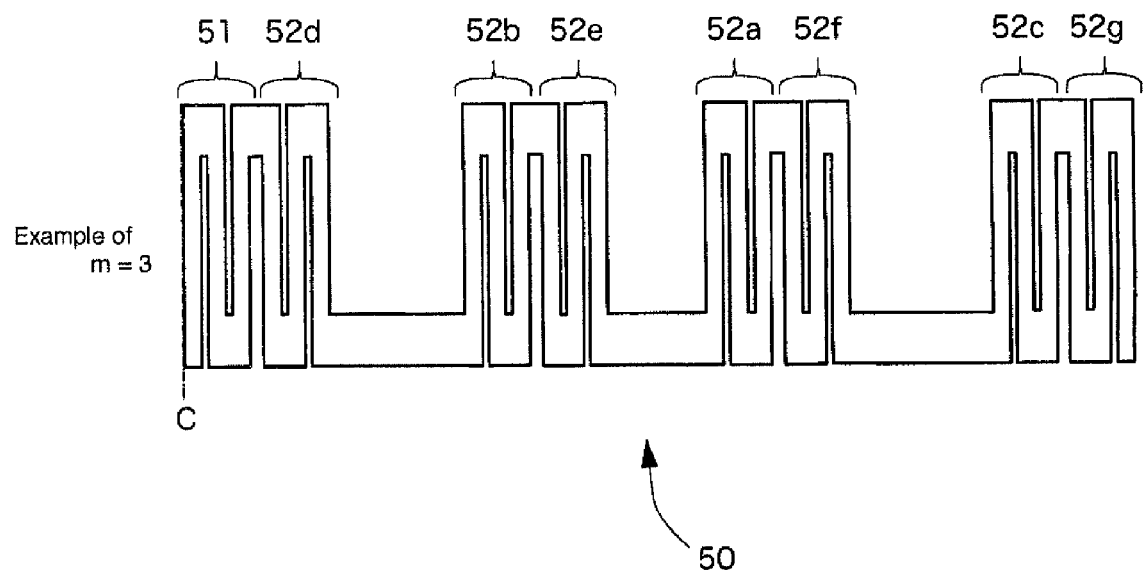
FIG. 5B is an explanatory diagram showing other examples of the arrangement of the magnetoresistive elements in the encoder according to the embodiment of the present disclosure.

Furthermore, the numbers of detecting element patterns and respective harmonic canceling patterns included in the basic pattern here each do not need to be one, and the basic pattern may be obtained by combining m magnetoresistive elements into a set for each of the patterns. In FIG. 5A and FIG. 5B, disposing examples of the respective patterns in the cases of m=2 and m=3 are shown.

In the present embodiment, the position detector 50 exemplified in FIG. 3 or FIG. 5A or FIG. 5B may be used as the basic pattern and a pattern obtained by disposing plural patterns of this basic pattern at intervals of $(L+\frac{1}{2})\lambda m$ (wherein L is 0 or a positive integer) and connecting the patterns in series may be formed.

Figure 6A:
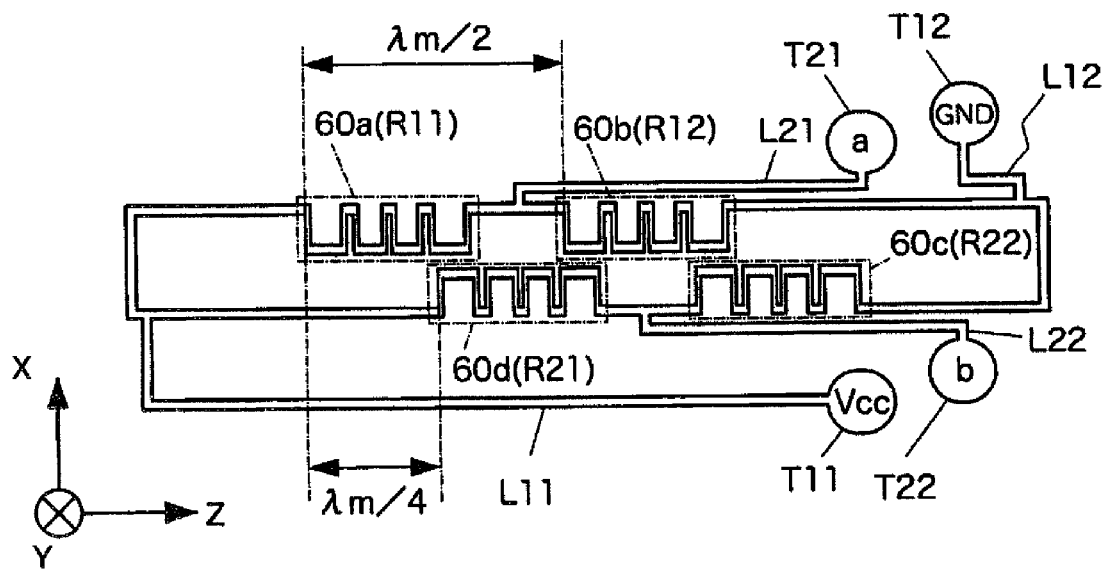
FIG. 6A is an explanatory diagram showing a wiring example of the magnetoresistive elements in the encoder according to the embodiment of the present disclosure.

Specifically, in an example of FIG. 6A, an example of a detecting circuit using the basic pattern that is the repetition unit exemplified in FIG. 3 is shown. As this basic pattern, instead of one exemplified in FIG. 3, another pattern such as one exemplified in FIG. 12 or FIG. 14 may be employed. In FIG. 6A, 60*a* and *b* are disposed along the movement direction at an interval of $\lambda m/2$. A terminal T11 of the basic pattern 60*a* on one side of the movement direction (left side of the diagram) is connected to a power supply (Vcc) and a terminal on the other side (right side of the diagram) is in common with a terminal T21 of the basic pattern 60*b* on one side (left side of the diagram). A terminal T12 of the basic pattern 60*b* on the other side (right side of the diagram) is connected to a ground (GND). The terminal T21 serves as the midpoint of the patterns. The respective terminals are equivalent to pads.

Furthermore, in the example of FIG. 6A, basic patterns 60*c* and *d* as each further one repetition unit are disposed at positions at a further interval of $(L+\frac{1}{4})\lambda m$ (wherein L is 0 or a positive integer) from a respective one of the basic patterns 60*a* and *b*. The basic pattern 60*c* is corresponding to a pattern obtained by vertically inverting the basic pattern 60*a* and the part other than the wiring part is the same as the basic pattern 60*a*. That is, the pitch of the element arrangement in the detecting element pattern and the harmonic canceling pattern is the same between the basic patterns 60*a* and 60*c*. The basic patterns and the terminals are connected by wiring (any of L11, L12, L21, and L22).

Figure 6B:
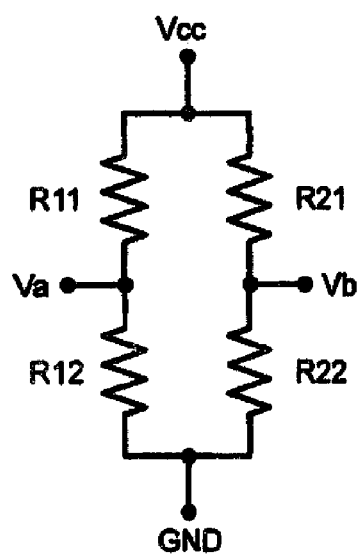
FIG. 6B is an explanatory diagram showing a wiring example of the magnetoresistive elements in the encoder according to the embodiment of the present disclosure.

These basic patterns 60*c* and *d* are also disposed offset by $\lambda m/2$. Furthermore, the terminal T11 of the basic pattern 60*d* on one side of the movement direction (left side of the diagram) is connected to the power supply (Vcc) and a terminal on the other side (right side of the diagram) is in common with a terminal T22 of the basic pattern 60*c* on one side (left side of the diagram). The terminal T12 of the basic pattern 60*c* on the other side (right side of the diagram) is connected to the ground (GND). Furthermore, the terminal T22 serves as the midpoint of the patterns. Therefore, this circuit forms a bridge circuit shown in FIG. 6B as a whole.

However, the interval between the magnetoresistive elements is determined by the resolution capability of exposure apparatus and photoresist used for forming the magnetoresistive elements. From this viewpoint, it is preferable that the interval between the magnetoresistive elements is at least 0.5 µm substantially. Moreover, when the line width of the magnetoresistive element becomes small, there is concern that breaking of the element due to static electricity is caused. On the other hand, the spatial resolution of the sensor output is lowered when the line width is too large. Therefore, it is preferable that the interval is set in a range of 1 to 20 µm substantially.

Therefore, in view of that, when the number of disposed magnetoresistive elements becomes large, this interval cannot be ensured and it becomes technically difficult to form the elements in some cases, the magnetoresistive element, the wiring part, and so forth may be connected through the via or interlayer wiring and the plane of the magnetic sensor 20 opposed to the magnetic medium 10 (flat plane: XZ plane in FIG. 1) may be made as multilayer planes (in the Y-axis direction in FIG. 1). In this case, if it is impossible or difficult to form a magnetoresistive element for reducing the same-order harmonic in the same layer, it is formed at least in an adjacent layer.

In the case of forming magnetoresistive elements in multiple layers in this manner, the magnetoresistive element for reducing the same-order harmonic is formed in the same layer if possible. In an example of FIG. 7, an example is shown in which the respective magnetoresistive elements pertaining to the detecting element pattern and the third-order and fifth-order harmonic canceling patterns are disposed in the first layer and magnetoresistive elements pertaining to the seventh-order harmonic canceling patterns are disposed in the second layer.

The thicknesses of the respective layers do not necessarily need to be the same. However, it is preferable that the thicknesses are within a range in which the distribution of the magnetic field from the magnetic medium 10 to the magnetoresistive elements included in the respective layers can be deemed to be equivalent, specifically are at such a degree as to be smaller than 800 nm in film thickness. Furthermore, as for the lower limit, it is preferable that the thicknesses exceed e.g. 80 nm in film thickness as a thickness of such a degree that electrostatic breakdown of the magnetoresistive element of the first layer and the magnetoresistive element of the second layer is not caused even when the interval between them in plan view is shorter than a predetermined range. Here, the film thickness refers to the distance from the surface of the magnetoresistive element formed in the i-th layer to the bottom of the (i+1)-th layer.

In an example of FIG. 8, the detecting element pattern and the third-order and fifth-order harmonic canceling patterns are disposed in the first layer. The seventh-order harmonic canceling patterns are disposed in the second layer and the eleventh-order harmonic canceling patterns are disposed in the third layer and the fourth layer.

Also in the case of forming magnetoresistive elements in a multilayer structure in this manner, the detecting element pattern and the respective magnetoresistive elements are so connected that the magnetoresistive elements are in series in increasing order of the distance from this detecting element pattern, in a meander manner by wiring passing through a through-hole and so forth ranging across layers.

Figure 9A:
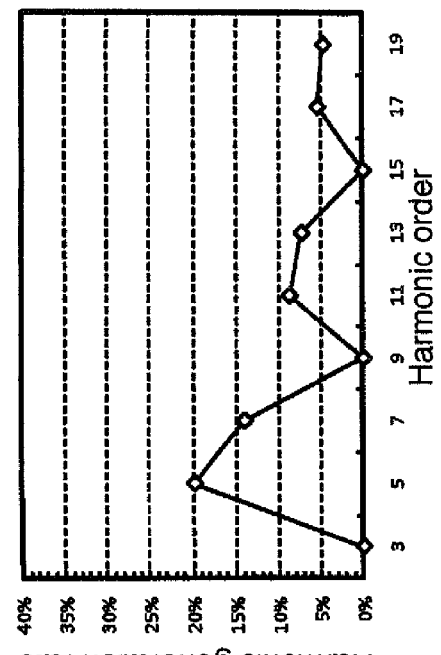
FIG. 9A is an explanatory diagram showing an example of components of a signal output by the encoder according to the embodiment of the present disclosure.
Figure 9B:
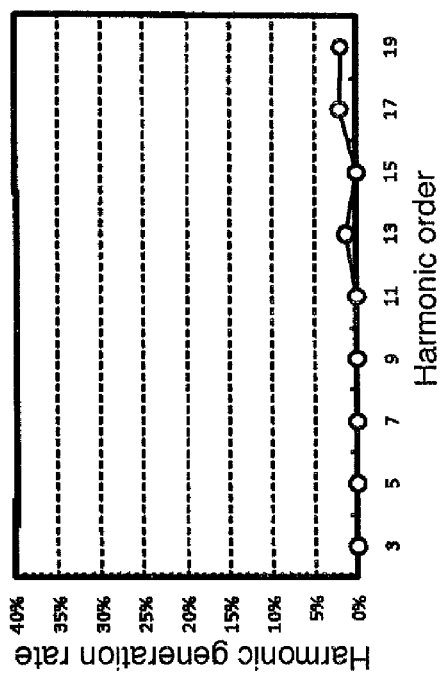
FIG. 9B is an explanatory diagram showing an example of components of a signal output by the encoder according to the embodiment of the present disclosure.

According to the encoder of the present embodiment, harmonics are canceled as shown by the outline in FIGS. 9A, 9B, 9C, and 9D. Each of FIGS. 9A, 9B, 9C, and 9D is an outline diagram representing the generation rate of harmonics (composition rates of harmonics included in the output signal). The abscissa of FIGS. 9A, 9B, 9C, and 9D indicates the order of the harmonic. In FIG. 9A, an example in which only the detecting element pattern is disposed is shown. Furthermore, FIG. 9B shows an example of the case in which a harmonic canceling pattern to cancel the third-order harmonic is provided for the detecting element pattern. As shown in FIG. 9B, components of multiples of 3 are reduced among harmonics of odd-orders higher than the third order.

Figure 9C:
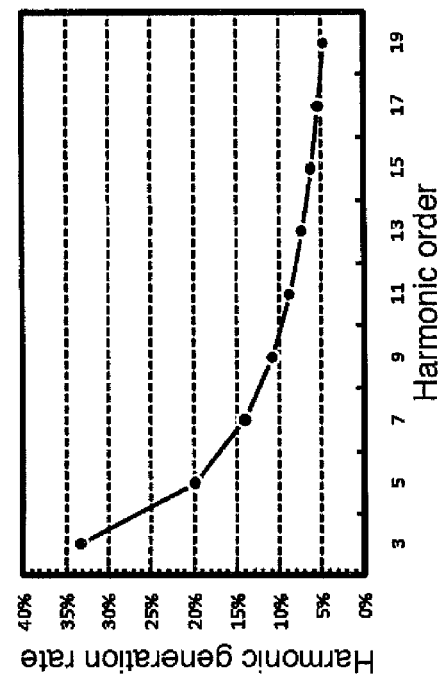
FIG. 9C is an explanatory diagram showing an example of components of a signal output by the encoder according to the embodiment of the present disclosure.
Figure 9D:
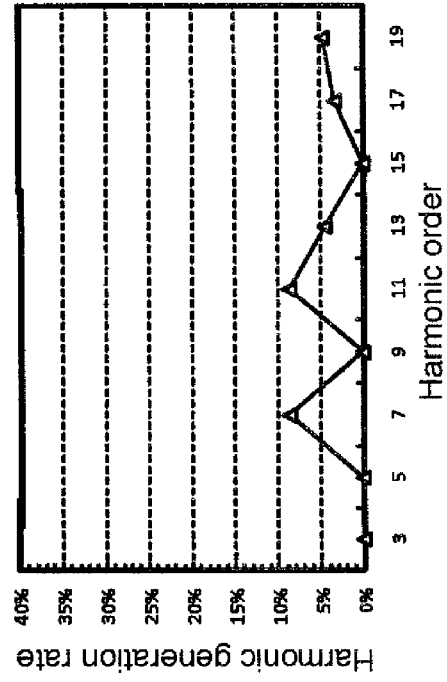
FIG. 9D is an explanatory diagram showing an example of components of a signal output by the encoder according to the embodiment of the present disclosure.

An example in which harmonic canceling patterns to cancel the third-order harmonic and the fifth-order harmonic are further provided is shown in FIG. 9C. As is understood from this example, the seventh-order harmonic is also somewhat reduced although a pattern corresponding to the seventh order is not provided. An example in which this is followed by further provision of harmonic canceling patterns to cancel the third-order, fifth-order, seventh-order, and eleventh-order harmonics is shown in FIG. 9D. In this example, most harmonic components up to the nineteenth order are smaller than 3%.

Furthermore, when the number of magnetoresistive elements disposed on one plane becomes large and it becomes technically difficult to form the magnetoresistive elements, instead of the configuration in which a multilayer structure is made as described above, the method for disposing the magnetoresistive elements may be changed as follows. In an example to be described below, in conjunction with providing a pattern (canceling pattern) to reduce a harmonic of a specific order or instead of this, a pattern (reducing pattern) to reduce harmonic components is provided.

Specifically, also as shown in FIGS. 9(c) and (d), when a harmonic canceling pattern to reduce a harmonic of a specific order is provided, harmonics of orders different from this specific order are also reduced. It is investigated how the generation rates of harmonics change in the case of providing a reducing pattern as follows in addition to providing the harmonic canceling patterns to cancel the third-order and fifth-order harmonics.

In the magnetic sensor 20 used here, the detecting element pattern is disposed and a magnetoresistive element is disposed at a position of $\lambda m/6$ from the detection position C in this detecting element pattern toward the disposing side of the relative movement direction. Furthermore, magnetoresistive elements are disposed at a position of $\lambda m/10$ and a position of $\lambda m/6 + \lambda m/10$ from the detection position C in this detecting element pattern toward the disposing side of the relative movement direction. Moreover, magnetoresistive elements are each disposed at a position offset by $\lambda m/(2 \times x)$, wherein x is an integer satisfying $5 < x \leq 19$, from a respective one of these four magnetoresistive elements toward the disposing side of the relative movement direction.

Figure 10:
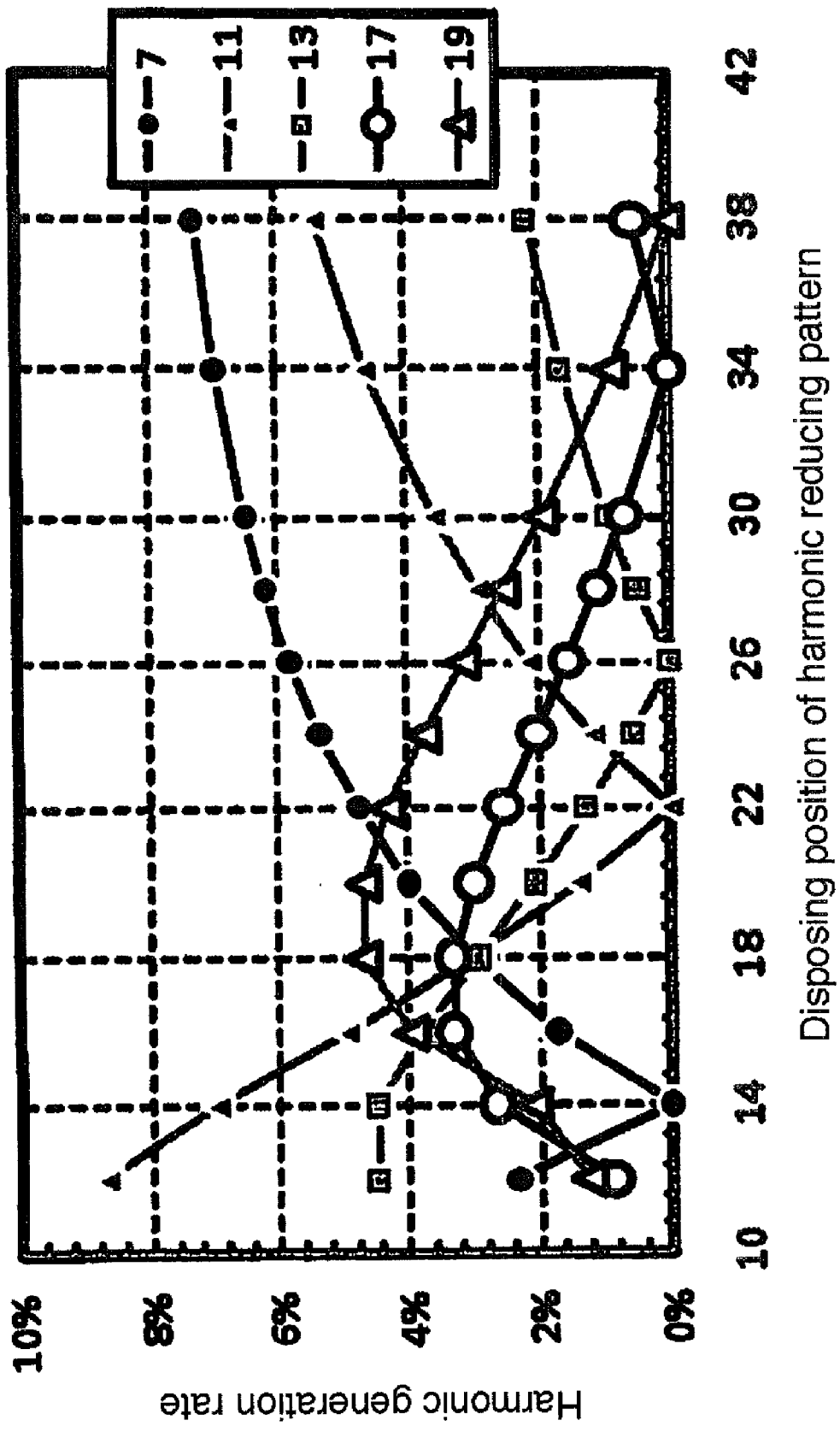
FIG. 10 is an explanatory diagram showing an example of decision of the disposing positions of the magnetoresistive elements as harmonic reducing patterns in the encoder according to the embodiment of the present disclosure.

How much the respective harmonics of the seventh order, eleventh order, thirteenth order, seventeenth order, and nineteenth order are included in the output signal (the generation rates of the harmonics of the fundamental) by the magnetic sensor 20 obtained in this manner is shown in FIG. 10. In FIG. 10, $(2 \times x)$ is plotted on the abscissa and the harmonic generation rate is plotted on the ordinate. In the example of FIG. 10, it is read that, when x=6, the seventh-order harmonic is about 2% but the eleventh-order harmonic is included by about 9%. Furthermore, it turns out that, in the case of x=7, the seventh-order harmonic is reduced but the eleventh-order harmonic is included by about 7%. On the other hand, when x=9 is set, the generation rates of the respective harmonics of the seventh order, eleventh order, thirteenth order, seventeenth order, and nineteenth order all become lower than 5%. An example in which the generation rates of the respective harmonics when x is changed by every 0.2 in a range from x=8 to x=10 are further investigated is shown in FIG. 11.

That is, in the present embodiment, the value of x with which reduction by the desired rate can be achieved is obtained from the generation rates of the harmonics of the respective orders experimentally investigated in this manner. Then, magnetoresistive elements are each disposed at a position offset by $\lambda m/(2 \times x)$ from a respective one of the magnetoresistive elements functioning as the detecting element pattern and the harmonic canceling patterns toward the disposing side of the relative movement direction.

Figure 11:
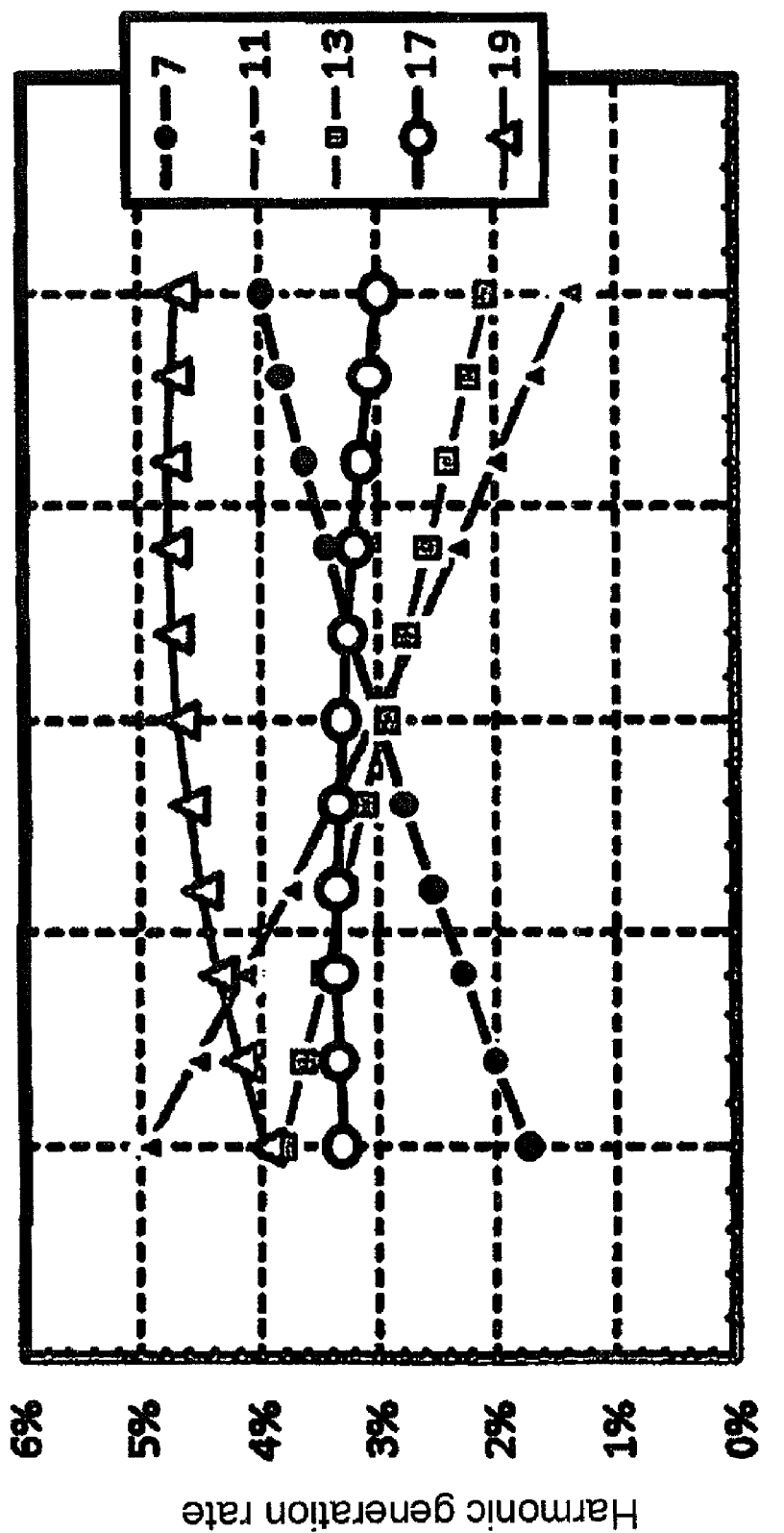
FIG. 11 is another explanatory diagram showing an example of decision of the disposing positions of the magnetoresistive elements as the harmonic reducing patterns in the encoder according to the embodiment of the present disclosure.

For example, with reference to FIGS. 10 and 11, x=9 is selected as x satisfying a condition that the generation rates of the respective harmonics of the seventh order, eleventh order, thirteenth order, seventeenth order, and nineteenth order are all lower than 5% and the generation rate of the eleventh-order harmonic is equal to or lower than 3%. In this case, one example of the pattern (basic pattern) of the magnetic sensor 20 forms a meander shape as a whole as shown in FIG. 12. Specifically, it includes the detecting element pattern including the magnetoresistive element 51 extending along the direction perpendicular to the movement direction, the harmonic canceling patterns 52a, b, . . . , and reducing patterns 53a, b, . . . connected in series to this magnetoresistive element 51.

Here, the harmonic canceling pattern is so configured as to include (on the disposing side of the relative movement direction regarding all patterns to be shown below) the pattern for canceling the third-order harmonic (harmonic canceling pattern 52a at a position of $\lambda m/6$ from the detection position C), the harmonic canceling patterns 52b and c disposed at a position of $\lambda m/10$ from the detection position C and a position of $\lambda m/10$ from the harmonic canceling pattern 52a, respectively, in order to cancel the fifth-order harmonic, and four magnetoresistive elements as the reducing patterns 53a, b, c, and d each disposed at a position to cancel the ninth-order harmonic from a respective one of the detection position C and the harmonic canceling patterns 52a, b, and c.

Furthermore, description will be made with reference to FIGS. 13 and 14 about an example in which the harmonic canceling patterns to cancel the harmonics of the third order, fifth order, and seventh order are provided and, for the harmonics of orders higher than them, reducing patterns to reduce them are disposed. Here, as the magnetic sensor 20, the detecting element pattern is disposed and a magnetoresistive element is disposed at a position of λm/6 from the detection position C in this detecting element pattern toward the disposing side of the relative movement direction. Furthermore, magnetoresistive elements are disposed at the respective positions of λm/10 and λm/14, the respective positions of λm/6+λm/10 and λm/6+λm/14, and the respective positions of λm/10+λm/14 and λm/6+λm/10+λm/14 from the detection position C in this detecting element pattern toward the disposing side of the relative movement direction. Moreover, magnetoresistive elements are each disposed at a position offset by λm/(2·x), wherein x is an integer satisfying 7<x≤19, from a respective one of these eight magnetoresistive elements toward the disposing side of the relative movement direction.

Figure 13A:
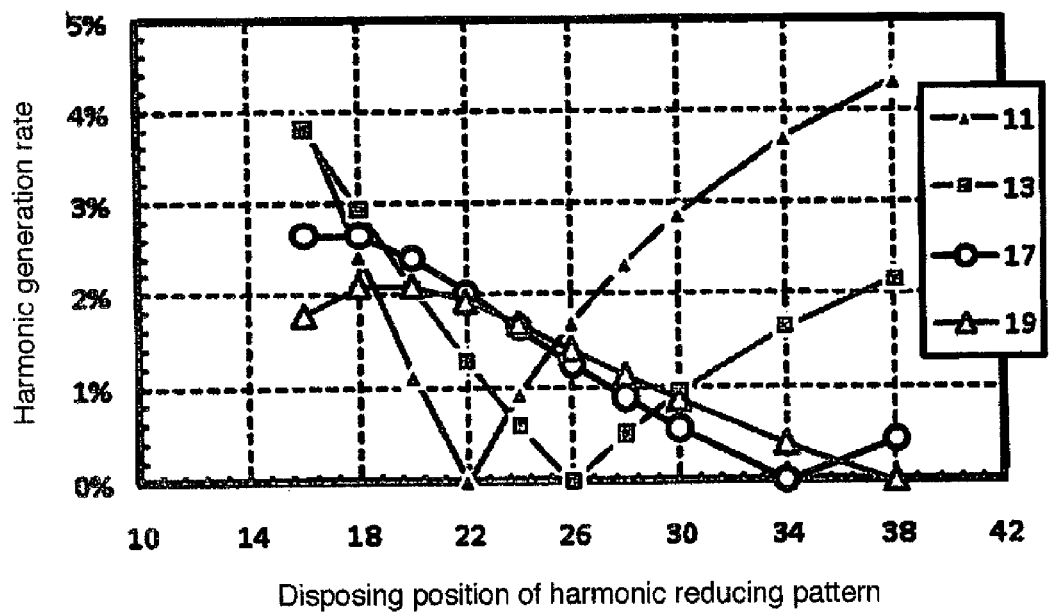
FIG. 13A is an explanatory diagram showing another example of decision of the disposing positions of the magnetoresistive elements as the harmonic reducing patterns in the encoder according to the embodiment of the present disclosure.
Figure 13B:
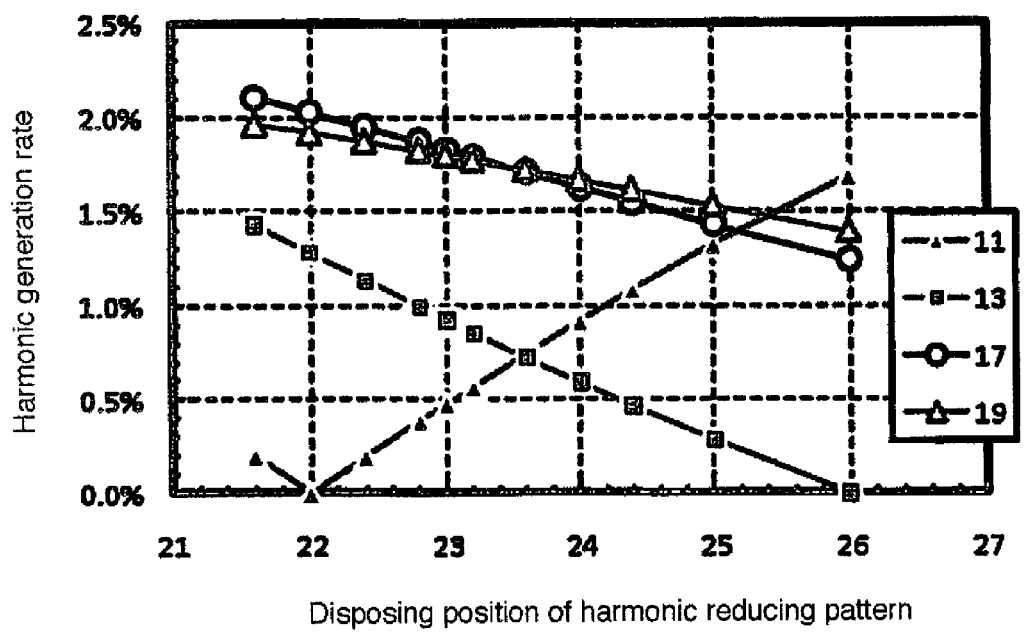
FIG. 13B is an explanatory diagram showing another example of decision of the disposing positions of the magnetoresistive elements as the harmonic reducing patterns in the encoder according to the embodiment of the present disclosure.
Figure 15A:
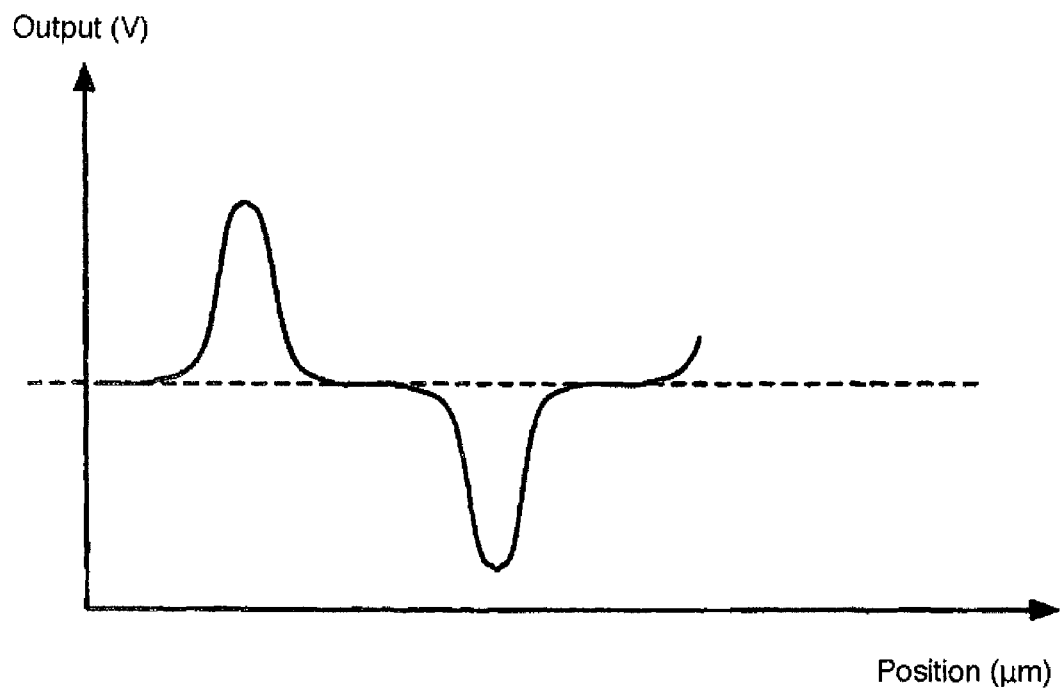
FIG. 15A is an explanatory diagram showing an example of an output signal of a magnetic encoder.
Figure 15B:
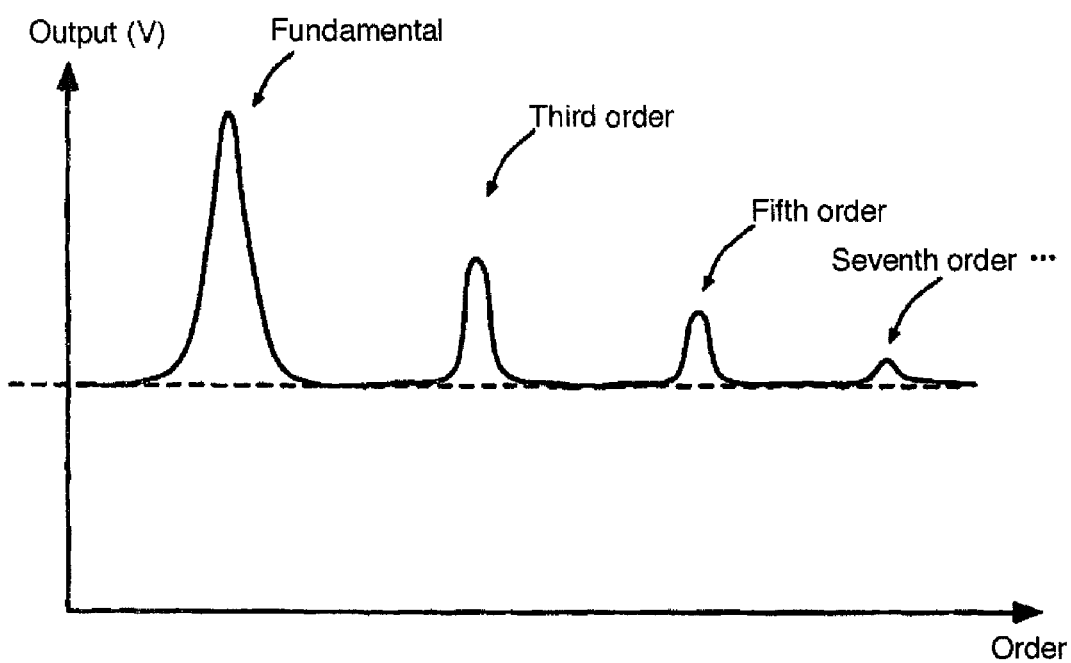
FIG. 15B is an explanatory diagram showing an example of an output signal of a magnetic encoder.
Figure 16:
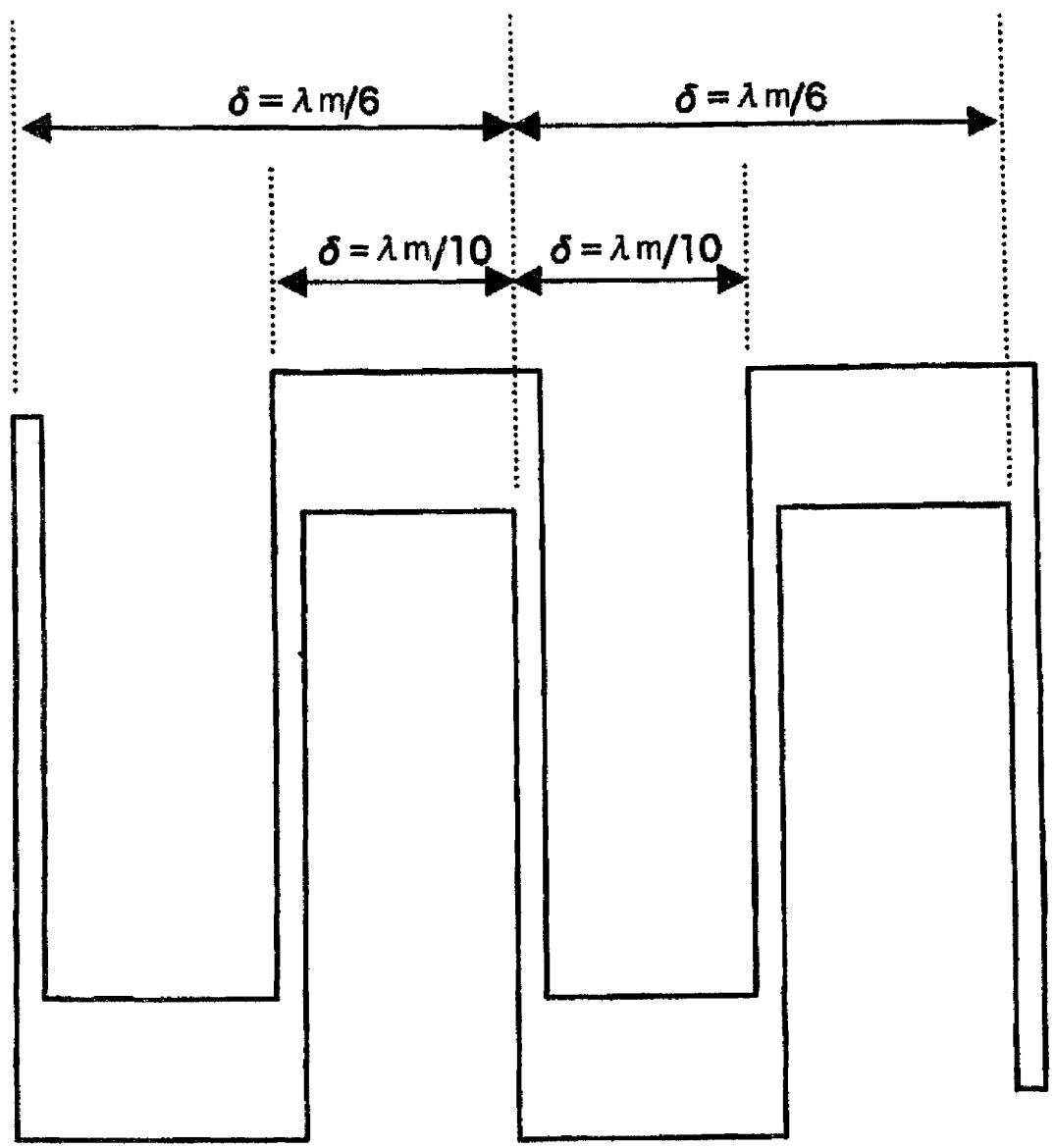
FIG. 16 is an explanatory diagram showing an arrangement example of magnetoresistive elements in the magnetic encoder.

Furthermore, an example in which the generation rates of harmonics of the eleventh order and higher orders are investigated with variation in this x is shown in FIG. 13A or FIG. 13B. FIG. 13A shows an example in which the generation rates are investigated with variation in x one by one about the respective values from x=8 to x=19. An example in which it is determined from this example that the optimum value of x is present in a range from x=11 to x=13 and the generation rates are investigated more finely in this range from x=11 to x=13 is shown in FIG. 13B. From FIG. 13B, x=11.8 is selected as the value of x with which harmonics of comparatively low orders become smaller. In this example of the present embodiment, the value of x may be a non-integer.

In the case of providing the harmonic canceling patterns to cancel the harmonics of the third order, fifth order, and seventh order and, for the harmonics of orders higher than them, disposing the reducing patterns to reduce them, x=11.8 (i.e. 2x=23.6) is set. Thus, as shown by an example of the basic pattern in FIG. 14, as the magnetic sensor 20, the detecting element pattern is disposed and magnetoresistive elements are disposed at the following positions.

(1) a position of λm/6 from the detection position C in this detecting element pattern toward the disposing side of the relative movement direction,
(2) the respective positions of λm/10 and λm/14, the respective positions of λm/6+λm/10 and λm/6+λm/14, and the respective positions of λm/10+λm/14 and 2λm/6+λm/10 λm/14 from the detection position C in this detecting element pattern toward the disposing side of the relative movement direction, and
(3) the respective positions of λm/23.6, λm/6+λm/23.6, λm/10+λm/23.6, λm/14 λm/23.6, λm/6+λm/10+λm/23.6, λm/6+λm/14 λm/23.6, λm/10+λm/14+λm/23.6, and λm/6+λm/10+λm/14+λm/23.6 from the detection position C in this detecting element pattern toward the disposing side of the relative movement direction.

In the example so far, it is assumed that the magnetoresistive element is a spin-valve type. However, the present embodiment is not limited thereto and it may be an AMR element and a multilayer GMR element. In these cases, with consideration for the relationship between λm and λs, positions obtained by multiplying the respective positions described in the embodiment by 2 are employed.

An encoder of the present embodiment is an encoder including a magnetic medium and a magnetic sensor that is opposed to the magnetic medium with the intermediary of a gap and moves relative to the magnetic medium, wherein
the magnetic medium is magnetized in the direction of the relative movement at a pitch λm,
the magnetic sensor includes a plurality of magnetoresistive elements whose electrical resistance value changes depending on a magnetic field at a place where the magnetoresistive element is disposed, and
a position where the magnetoresistive element is disposed is defined as a reference position and, in addition to the magnetoresistive element of the reference position, the magnetoresistive elements as harmonic reducing patterns are disposed at the following positions, with P(n) defined as an n-th prime, wherein n is a natural number,
    a position offset by λm/(2·P(n)) from the reference position toward at least one side of the direction of the relative movement in plan view, wherein N≥n>1 and N is a natural number satisfying N>3, and
    a position further offset by λm/(2·P(L+1)) from a position offset by λm/(2·P(L)) from the reference position toward at least the one side of the direction of the relative movement in plan view, wherein P(L) is an L-th prime and L is a natural number satisfying 1<L<N.

Here, the magnetoresistive elements as the harmonic reducing patterns may be disposed at the following positions,
    a position offset by λm/(2·P(2))=λm/6 and a position offset by λm/(2·P(3))=λm/10 from the reference position toward the one side in plan view, and
    a position further offset by λm/(2·P(2+1))=λm/10 from the position offset by λm/(2·P(2))=λm/6 from the reference position toward at least the one side of the direction of the relative movement in plan view.

Moreover, part of the magnetoresistive elements as the harmonic reducing patterns may be disposed in a layer different from a layer of the magnetoresistive element of the reference position in a plane opposed to the magnetic medium.

Furthermore, an encoder according to one aspect of the present embodiment is an encoder including a magnetic medium and a magnetic sensor that is opposed to the magnetic medium with the intermediary of a gap and moves relative to the magnetic medium, wherein
the magnetic medium is magnetized in the direction of the relative movement at a pitch λm,
the magnetic sensor includes a plurality of magnetoresistive elements whose electrical resistance value changes depending on a magnetic field at a place where the magnetoresistive element is disposed,
a position where the magnetoresistive element is disposed is defined as a reference position and, in addition to the magnetoresistive element of the reference position, the magnetoresistive elements as harmonic reducing patterns are disposed at the following positions, with P(n) defined as an n-th prime, wherein n is a natural number,
    a position offset by λm/(2·P(n)) from the reference position toward at least one side of the direction of the relative movement in plan view, wherein N≥n>1 and N is a natural number satisfying N>2, and
    a position further offset by λm/(2·P(L+1)) from a position offset by λm/(2·P(L)) from the reference position toward at least the one side of the direction of the relative movement in plan view, wherein P(L) is an L-th prime and L is a natural number satisfying 1<L<N, and
    x satisfying P(N+1)<x and x≠P(k), wherein k is a natural number satisfying 1<k, is set and the magnetoresistive elements as the harmonic reducing patterns are disposed at the following positions,
    a position offset by λm/(2x) from the reference position toward at least the one side of the direction of the relative movement in plan view, and a position further offset by $\lambda m/(2x)$ from the position offset by $\lambda m/(2 \cdot P(L))$, wherein $1<L<N$, from the reference position toward at least the one side of the direction of the relative movement in plan view.

Here, the magnetoresistive elements as the harmonic reducing patterns may be disposed at the following positions, a position offset by $\lambda m/(2 \cdot P(2))=\lambda m/6$ and a position offset by $\lambda m/(2 \cdot P(3))=\lambda m/10$ from the reference position toward the one side in plan view, and a position further offset by $\lambda m/(2 \cdot P(2+1))=km/10$ from the position offset by $\lambda m/(2 \cdot P(2))=\lambda m/6$ from the reference position toward at least the one side of the direction of the relative movement in plan view, and x satisfying $5<x$ and $x \ne P(k)$, wherein k is a natural number satisfying $1<k$, may be set and the magnetoresistive elements as the harmonic reducing patterns may be disposed at the following positions, a position offset by $\lambda m/(2x)$ from the reference position toward at least the one side of the direction of the relative movement in plan view, a position further offset by $\lambda m/(2x)$ from the position offset by $\lambda m/(2 \cdot P(2))=\lambda m/6$ from the reference position toward at least the one side of the direction of the relative movement in plan view, a position further offset by $\lambda m/(2x)$ from the position offset by $\lambda m/(2 \cdot P(3))=\lambda m/10$ from the reference position toward at least the one side of the direction of the relative movement in plan view, and a position further offset by $\lambda m/(2x)$ from the position offset by $\lambda m/(2 \cdot P(2))=\lambda m/6$ and $\lambda m/(2 \cdot P(3))=\lambda m/10$ from the reference position toward at least the one side of the direction of the relative movement in plan view.

EXPLANATION OF REFERENCE NUMERALS

10 Magnetic medium,
20 Magnetic sensor,
11 Magnetic medium element,
21 Base,
22 Magneto-sensitive element,
31 Pinned layer,
32 Non-magnetic intermediate layer,
33 Free layer,
34 Protective layer,
51 Magnetoresistive element,
52 Harmonic canceling pattern,
53 Harmonic reducing pattern,
60 Basic pattern

The invention claimed is:

1. An encoder including a magnetic medium and a magnetic sensor that is opposed to the magnetic medium with intermediary of a gap and moves relative to the magnetic medium, wherein the magnetic medium is magnetized in direction of the relative movement at a pitch $\lambda m$, the magnetic sensor includes a plurality of magnetoresistive elements whose electrical resistance value changes depending on a magnetic field at a place where each magnetoresistive element is disposed, and a position where a first magnetoresistive element is disposed is defined as a reference position and, in addition to the first magnetoresistive element of the reference position, second magnetoresistive elements as harmonic reducing patterns are disposed at following positions, with P(n) defined as an n-th prime, wherein n is a natural number, a position offset by $\lambda m/(2 \cdot P(n))$ from the reference position toward at least one side of the direction of the relative movement in plan view, wherein $N \ge n > 1$ and N is a natural number satisfying $N>3$, a position further offset by $\lambda m/(2 \cdot P(L+1))$ from a position offset by $\lambda m/(2 \cdot P(L))$ from the reference position toward at least the one side of the direction of the relative movement in plan view, wherein P(L) is an L-th prime and L is a natural number satisfying $1<L<N$, a position offset by $\lambda m/(2 \cdot P(2))=\lambda m/6$, a position offset by $\lambda m/(2 \cdot P(3))=\lambda m/10$, and a position offset by $\lambda m/(2 \cdot P(4))=\lambda m/14$ from the reference position toward the one side in plan view, a position further offset by $\lambda m/(2 \cdot P(2+1))=\lambda m/10$ from the position offset by $\lambda m/(2 \cdot P(2))=\lambda m/6$ from the reference position toward at least the one side of the direction of the relative movement in plan view, and a position further offset by $\lambda m/(2 \cdot P(3+1))=\lambda m/14$ from the position offset by $\lambda m/(2 \cdot P(2))=\lambda m/6$ toward said one side of the direction, and a position further offset by $\lambda m/(2 \cdot P(3+1))=\lambda m/14$ from the position offset by $\lambda m/(2 \cdot P(3))=\lambda m/10$ from the reference position toward said one side of the direction of the relative movement in plan view.

2. The encoder according to claim 1, wherein part of the second magnetoresistive elements as the harmonic reducing patterns is disposed in a layer different from a layer of the first magnetoresistive element of the reference position in a plane opposed to the magnetic medium.

3. An encoder including a magnetic medium and a magnetic sensor that is opposed to the magnetic medium with intermediary of a gap and moves relative to the magnetic medium, wherein the magnetic medium is magnetized in direction of the relative movement at a pitch $\lambda m$, the magnetic sensor includes a plurality of magnetoresistive elements whose electrical resistance value changes depending on a magnetic field at a place where each magnetoresistive element is disposed, a position where a first magnetoresistive element is disposed is defined as a reference position and, in addition to the first magnetoresistive element of the reference position, second magnetoresistive elements as harmonic reducing patterns are disposed at following positions, with P(n) defined as an n-th prime, wherein n is a natural number, a position offset by $\lambda m/(2 \cdot P(n))$ from the reference position toward at least one side of the direction of the relative movement in plan view, wherein $N \ge n > 1$ and N is a natural number satisfying $N>2$, and a position further offset by $\lambda m/(2 \cdot P(L+1))$ from a position offset by $\lambda m/(2 \cdot P(L))$ from the reference position toward at least the one side of the direction of the relative movement in plan view, wherein P(L) is an L-th prime and L is a natural number satisfying $1<L<N$, and x satisfying $P(N+1)<x$ and $x \ne P(k)$, wherein k is a natural number satisfying $1<k$, is set and the second magnetoresistive elements as the harmonic reducing patterns are disposed at following positions, a position offset by $\lambda m/(2x)$ from the reference position toward at least the one side of the direction of the relative movement in plan view, and a position further offset by $\lambda m/(2x)$ from the position offset by $\lambda m/(2 \cdot P(L))$, wherein $1<L<N$, from the reference position toward at least the one side of the direction of the relative movement in plan view.

4. The encoder according to claim 3, wherein the second magnetoresistive elements as the harmonic reducing patterns are disposed at following positions, a position offset by $\lambda m/(2 \cdot P(2)) = \lambda m/6$ and a position offset by $\lambda m/(2 \cdot P(3)) = \lambda m/10$ from the reference position toward the one side in plan view, and a position further offset by $\lambda m/(2 \cdot P(2+1)) = \lambda m/10$ from the position offset by $\lambda m/(2 \cdot P(2)) = \lambda m/6$ from the reference position toward at least the one side of the direction of the relative movement in plan view, and x satisfying $5 < x$ and $x \neq P(k)$, wherein k is a natural number satisfying $1 < k$, is set and the d magnetoresistive elements as the harmonic reducing patterns are disposed at following positions, a position offset by $\lambda m/(2x)$ from the reference position toward at least the one side of the direction of the relative movement in plan view, a position further offset by $\lambda m/(2x)$ from the position offset by $\lambda m/(2 \cdot P(2)) = \lambda m/6$ from the reference position toward at least the one side of the direction of the relative movement in plan view, a position further offset by $\lambda m/(2x)$ from the position offset by $\lambda m/(2 \cdot P(3)) = \lambda m/10$ from the reference position toward at least the one side of the direction of the relative movement in plan view, and a position further offset by $\lambda m/(2x)$ from the position offset by $\lambda m/(2 \cdot P(2)) = \lambda m/6$ and $\lambda m/(2 \cdot P(3)) = \lambda m/10$ from the reference position toward at least the one side of the direction of the relative movement in plan view.

5. The encoder according to claim 1, wherein part of the second magnetoresistive elements as the harmonic reducing patterns is disposed in a layer different from a layer of the first magnetoresistive element of the reference position in a plane opposed to the magnetic medium.

* * * * *